(12) United States Patent
Heukensfeldt Jansen et al.

(10) Patent No.: US 10,996,306 B2
(45) Date of Patent: May 4, 2021

(54) MRI SYSTEM AND METHOD USING NEURAL NETWORK FOR DETECTION OF PATIENT MOTION

(71) Applicant: General Electric Company, Schenectady, NY (US)

(72) Inventors: Isabelle Heukensfeldt Jansen, Schenectady, NY (US); Sangtae Ahn, Guilderland, NY (US); Christopher Judson Hardy, Schenectady, NY (US); Itzik Malkiel, Givatayim (IL); Rafael Shmuel Brada, Hod-Hasharon (IL); Ron Wein, Ramat Hasharon (IL); Michael Rotman, Petach-Tikva (IL)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 69 days.

(21) Appl. No.: 16/394,791

(22) Filed: Apr. 25, 2019

(65) Prior Publication Data
US 2020/0341100 A1 Oct. 29, 2020

(51) Int. Cl.
*G06T 7/20* (2017.01)
*G01R 33/565* (2006.01)
(Continued)

(52) U.S. Cl.
CPC ... *G01R 33/56509* (2013.01); *G01R 33/4818* (2013.01); *G01R 33/5608* (2013.01); *G06K 9/6257* (2013.01); *G06N 3/08* (2013.01); *G06T 7/0016* (2013.01); *G06T 7/20* (2013.01); *G06T 11/008* (2013.01); *G06T 2207/10088* (2013.01);
(Continued)

(58) Field of Classification Search
CPC combination set(s) only.
See application file for complete search history.

(56) References Cited

U.S. PATENT DOCUMENTS 7,078,898 B2  7/2006 Bydder
9,588,207 B2 *  3/2017 Weller ............... G01R 33/5611
(Continued)

FOREIGN PATENT DOCUMENTS

GB  2545641 A  6/2017

OTHER PUBLICATIONS

Andre, et al., "Toward Quantifying the Prevalence, Severity, and Cost Associated With Patient Motion During Clinical MR Examinations," Journal. Am. Coll. Radiol., 12:689-695, vol. 12, No. 7, 7 pages, Jul. 2015.
(Continued)

*Primary Examiner* — Cindy Trandai
(74) *Attorney, Agent, or Firm* — Fletcher Yorder, P.C.

(57) ABSTRACT

A magnetic resonance imaging (MRI) system includes control and analysis circuitry having programming to acquire magnetic resonance (MR) data using coil elements of the MRI system, analyze the MR data, and reconstruct the MR data into MR sub-images. The system also includes a trained neural network associated with the control and analysis circuitry to transform the MR sub-images into a prediction relating to a presence and extent of motion corruption in the MR sub-images. The programming of the control and analysis circuitry includes instructions to control operations of the MRI system based at least in part on the prediction of the trained neural network.

20 Claims, 15 Drawing Sheets

(51) Int. Cl.
    *G01R 33/56*     (2006.01)
    *G01R 33/48*     (2006.01)
    *G06T 11/00*     (2006.01)
    *G06T 7/00*     (2017.01)
    *G06K 9/62*     (2006.01)
    *G06N 3/08*     (2006.01)

(52) U.S. Cl.
    CPC ............... *G06T 2207/20081* (2013.01); *G06T 2207/20084* (2013.01); *G06T 2207/20216* (2013.01)

(56) References Cited

U.S. PATENT DOCUMENTS

| | | | |
|---|---|---|---|
| 10,073,160 B2* | 9/2018 | Boernert | G01R 33/56509 |
| 2008/0279433 A1* | 11/2008 | Brau | G06K 9/28 |
| | | | 382/131 |
| 2010/0142789 A1* | 6/2010 | Chang | A61B 5/055 |
| | | | 382/131 |
| 2010/0244825 A1* | 9/2010 | Brau | G01R 33/5611 |
| | | | 324/309 |
| 2010/0260397 A1* | 10/2010 | Block | G01R 33/5614 |
| | | | 382/131 |
| 2011/0093233 A1* | 4/2011 | Griswold | G01R 33/4824 |
| | | | 702/106 |
| 2013/0101198 A1* | 4/2013 | Grodzki | G01R 33/48 |
| | | | 382/131 |
| 2013/0236075 A1* | 9/2013 | Smith | G01R 33/5659 |
| | | | 382/131 |
| 2013/0294674 A1* | 11/2013 | Miyamoto | G06T 7/0014 |
| | | | 382/132 |
| 2014/0079305 A1* | 3/2014 | Akcakaya | G06T 7/20 |
| | | | 382/131 |
| 2014/0296698 A1* | 10/2014 | Bauer | A61B 5/055 |
| | | | 600/411 |
| 2016/0000383 A1 | 1/2016 | Lee et al. | |
| 2017/0016972 A1* | 1/2017 | Bhat | G01R 33/5611 |
| 2017/0177993 A1* | 6/2017 | Draelos | G06N 3/0454 |
| 2017/0337682 A1* | 11/2017 | Liao | G06T 7/30 |
| 2017/0372193 A1 | 12/2017 | Mailhe et al. | |
| 2018/0144214 A1* | 5/2018 | Hsieh | G06N 3/08 |
| 2018/0232878 A1 | 8/2018 | Braun et al. | |
| 2019/0004134 A1* | 1/2019 | Hara | G01R 33/4818 |
| 2019/0128989 A1* | 5/2019 | Braun | G06N 3/0472 |
| 2019/0195975 A1* | 6/2019 | Liu | G01R 33/561 |
| 2019/0213761 A1* | 7/2019 | Rosen | A61B 5/0035 |
| 2019/0219654 A1* | 7/2019 | Park | G01R 33/482 |
| 2019/0244399 A1* | 8/2019 | Li | G01R 33/5611 |
| 2019/0261940 A1* | 8/2019 | Son | A61B 6/463 |
| 2019/0347834 A1* | 11/2019 | Nagashima | G01R 33/5611 |
| 2020/0035350 A1* | 1/2020 | Sullivan | G06T 11/00 |
| 2020/0049785 A1* | 2/2020 | Liu | G01R 33/4826 |
| 2020/0051239 A1* | 2/2020 | Braun | G01R 33/5608 |
| 2020/0065964 A1* | 2/2020 | Takeshima | G06T 7/0012 |
| 2020/0074166 A1* | 3/2020 | Nathaniel | G06K 9/00369 |
| 2020/0092556 A1* | 3/2020 | Coelho | H04N 19/124 |
| 2020/0121294 A1* | 4/2020 | Tsymbalenko | A61B 8/5276 |
| 2020/0160972 A1* | 5/2020 | Beriault | G16H 30/40 |
| 2020/0202586 A1* | 6/2020 | Li | G01R 33/4818 |
| 2020/0225303 A1* | 7/2020 | Heidemann | G01R 33/5611 |
| 2020/0233052 A1* | 7/2020 | Carinci | G01R 33/482 |
| 2020/0249300 A1* | 8/2020 | Sandino | G06T 11/008 |
| 2020/0265318 A1* | 8/2020 | Malkiel | G06N 3/0454 |
| 2020/0319283 A1* | 10/2020 | Wang | A61B 5/055 |

OTHER PUBLICATIONS

Pawar, et al., "Motion Correction in MRI using Deep Convolutional Neural Network," Proc. Intl. Soc. Mag. Reson. Med., https://index.mirasmart.com/ISMRM2018/PDFfiles/1174.html, Conference: ISMRM, 3 pages, Jun. 2018.

Pawar, et al., "MoCoNet: Motion Correction in 3D MPRAGE images using a Convolutional Neural Network approach," Magnetic Resonance in Medicine, pp. 1-20, Jul. 2018.

* cited by examiner

No motion

Motion-corrupted

No motion

Motion-corrupted

MRI SYSTEM AND METHOD USING NEURAL NETWORK FOR DETECTION OF PATIENT MOTION

BACKGROUND

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

Patient motion is one of the biggest sources of inefficiency in clinical MRI, often requiring re-scans or even second visits by the patient. In particular, patient motion can cause blurriness, artifacts, and other inconsistencies in MR images. Certain approaches to correct motion require either some sort of hardware for monitoring the motion (adding to cost and patient setup time), or navigator sequences (which take time away from the imaging sequence). Accordingly, a need exists for improved methods for data acquisition and reconstruction in magnetic resonance imaging techniques that are sensitive to patient motion.

BRIEF DESCRIPTION

In one embodiment, a magnetic resonance imaging (MRI) method includes producing a first sub-image from first magnetic resonance (MR) partial k-space data acquired by an MRI system during a first time interval and producing a second sub-image from second MR partial k-space data from a different part of k-space acquired by the MRI system during a second time interval. The first time interval and the second time interval are adjacent to one another in time. The method also includes combining the first sub-image and the second sub-image to generate a combined sub-image; using a trained neural network to generate a prediction relating to the presence and extent of motion occurring between the first time interval and the second time interval using the combined sub-image as an input; and performing further operations of the MRI system based at least partially on the prediction generated by the trained neural network.

In another embodiment, a computer-based method that generates a trained neural network to generate predictions relating to the presence and extent of motion in magnetic resonance (MR) sub-images includes providing training data including motion-corrupted sub-images as available inputs and corresponding motion scores as outputs; training, using the training data, a neural network to transform an MR sub-image into a corresponding motion score that indicates whether motion occurred during an MRI scan used to obtain data for the MR sub-image. The motion-corrupted sub-images are generated from at least one motion-free sub-image, and the motion scores are calculated as an entropy-of-the-difference between the at least one motion-free sub-image and a corresponding one of the motion-corrupted sub-images.

In a further embodiment, a magnetic resonance imaging (MRI) system includes control and analysis circuitry having programming to acquire magnetic resonance (MR) data using coil elements of the MRI system, analyze the MR data, and reconstruct the MR data into MR sub-images. The system also includes a trained neural network associated with the control and analysis circuitry to transform the MR sub-images into a prediction relating to a presence and extent of motion corruption in the MR sub-images. The programming of the control and analysis circuitry includes instructions to control operations of the MRI system based at least in part on the prediction of the trained neural network.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As set forth above, patient motion is one of the biggest sources of inefficiency in clinical MRI, often requiring re-scans or even second visits by the patient. Research has shown that patient motion can lead to repeated acquisition sequences in as much as 20% of MRI exams. This results in significant annual losses for every scanner as throughput is reduced.

The present disclosure includes a system and method for detecting, timing, and adapting to patient motion during or after an MR scan, without the need for external tracking hardware. Once the timing is known, various actions can be taken, including restarting the scan, reacquiring those portions of k-space acquired before the movement, or correcting for the motion using the existing data. This correction is done either using a deep-learning neural network or an iterative optimization approach. Disclosed embodiments also include an adaptive system for detecting patient motion in real time during an MR scan without the need for external monitoring devices or navigation, with the option of adjusting scan parameters to compensate for inconsistent data. The system uses a neural network (e.g., a convolutional neural network implemented as a specialized processor or processors or emulated via software) trained on motion-corrupted images to detect motion in as little as $1/16$th of k-space. Once motion is detected, the system can track multiple separate sub-images to be combined into a motion-free image or can adjust the scan to re-acquire sections of k-space taken before the motion occurred.

Figure 1:
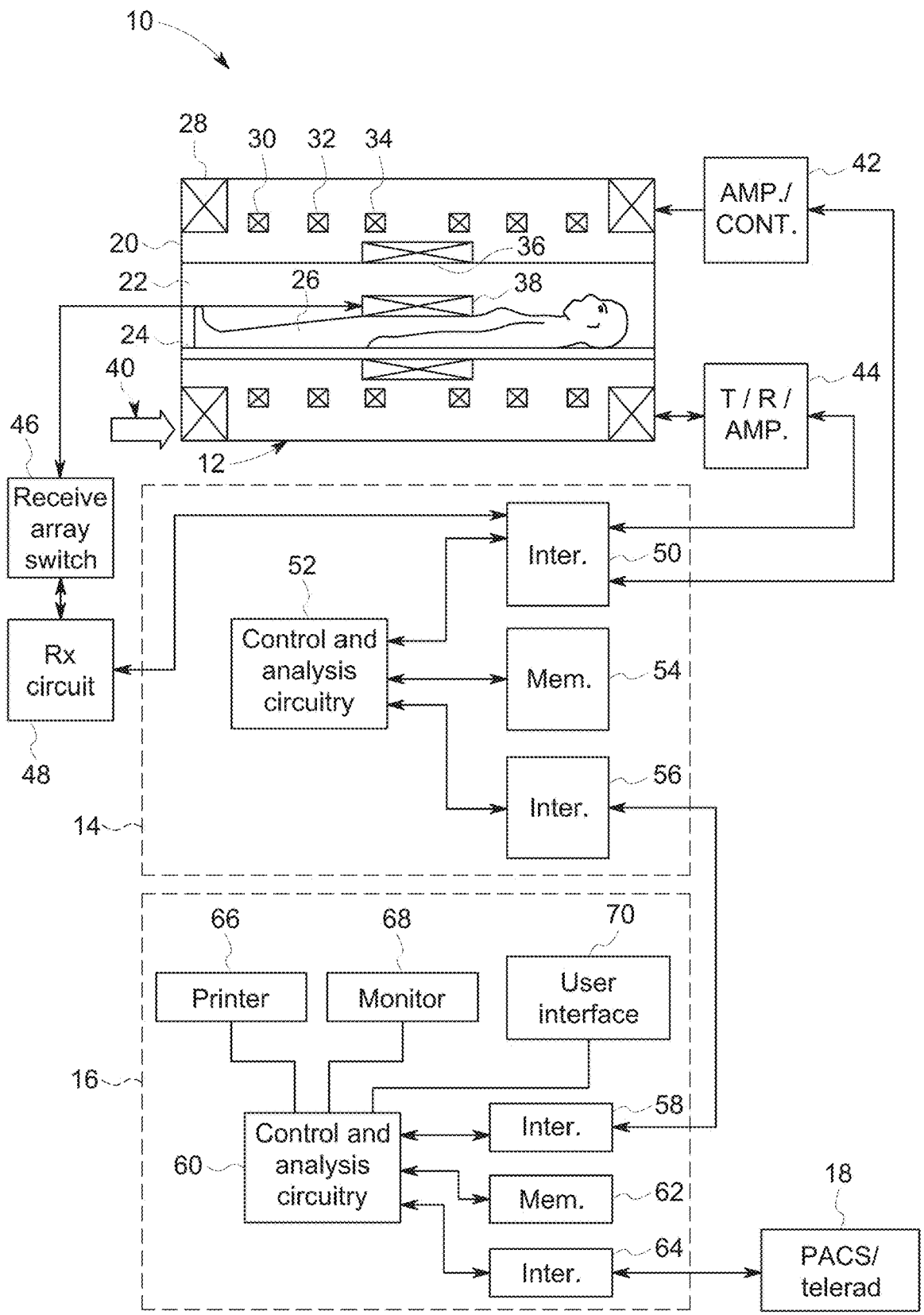
FIG. 1 is a diagrammatic illustration of an embodiment of a magnetic resonance imaging system configured to perform the data acquisition, motion detection and scoring, and image reconstruction described herein.

An example system for performing the techniques described herein is discussed with respect to FIG. 1. The embodiments described herein may be performed by a magnetic resonance imaging (MRI) system, wherein specific imaging routines (e.g., accelerated imaging routines for MRI sequences) are initiated by a user (e.g., a radiologist). Further, the MRI system may perform data acquisition, data correction, and image reconstruction. Accordingly, referring to FIG. 1, a magnetic resonance imaging system 10 is illustrated schematically as including a scanner 12, a scanner control circuit 14, and a system control circuitry 16. According to the embodiments described herein, the MRI system 10 is generally configured to perform MR imaging, such as imaging sequences with adaptive motion correction, various weighting techniques, fluid attenuation techniques, perfusion techniques, tensor imaging, and so on. System 10 additionally includes remote access and storage systems or devices such as picture archiving and communication systems (PACS) 18, or other devices such as teleradiology equipment so that data acquired by the system 10 may be accessed on- or off-site. In this way, acquired data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient. In addition to the coils that may be local to the scanner 12, the system 10 also includes a set of receiving coils 38 (e.g., a phased array of coils) configured for placement proximal (e.g., against) the patient 26. The receiving coils 38 may have any geometry, including both enclosed and single-sided geometries. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provided for pulsing the gradient field coils 30, 32, and 34. Such a circuit may include amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46 that is capable of switching the receiving coils 38 between receiving and non-receiving modes such that the receiving coils 38 resonate with the RF signals produced by relaxing gyromagnetic nuclei from within the patient 26 while in the receiving state, and they do not resonate with RF energy from the transmitting coils (i.e., coil 36) so as to prevent undesirable operation while in the non-receiving state. Additionally, a receiving circuit 48 is provided for receiving the data detected by the receiving coils 38, and may include one or more multiplexing and/or amplification circuits.

It should be noted that while the scanner 12 and the control/amplification circuitry described above are illustrated as being coupled by a single line, that many such lines may occur in an actual instantiation. For example, separate lines may be used for control, data communication, and so on. Further, suitable hardware may be disposed along each type of line for the proper handling of the data. Indeed, various filters, digitizers, and processors may be disposed between the scanner and either or both of the scanner and system control circuitry 14, 16. By way of non-limiting example, certain of the control and analysis circuitry described in detail below, although illustrated as a single unit, includes additional hardware such as image reconstruction hardware configured to perform the motion correction and image reconstruction techniques described herein. Further, in certain embodiments, the control and analysis circuitry described herein may be associated with a trained neural network used for motion detection and/or another trained neural network used for image reconstruction. Indeed, where a neural network is described in the present disclosure, it should be noted that the neural network may be associated with (e.g., a part of or connected to) the MRI system 10. The neural network may, for example, be implemented as specific hardware components (e.g., specialized processors), or may be implemented as software via an emulation on a computing platform.

As illustrated, scanner control circuit 14 includes an interface circuit 50 which outputs signals for driving the gradient field coils and the RF coil and for receiving the data representative of the magnetic resonance signals produced in examination sequences. The interface circuit 50 is coupled to a control and analysis circuit 52. The control and analysis circuit 52 executes the commands for driving the circuit 42 and circuit 44 based on defined protocols selected via system control circuit 16. Control and analysis circuit 52 also serves to receive the magnetic resonance signals and performs subsequent processing before transmitting the data to system control circuit 16. Scanner control circuit 14 also includes one or more memory circuits 54, which store configuration parameters, pulse sequence descriptions, examination results, and so forth, during operation. Interface circuit 56 is coupled to the control and analysis circuit 52 for exchanging data between scanner control circuit 14 and system control circuit 16. Such data will typically include selection of specific examination sequences to be performed, configuration parameters of these sequences, and acquired data, which may be transmitted in raw or processed form from scanner control circuit 14 for subsequent processing, storage, transmission and display. Therefore, in certain embodiments, the control and analysis circuit 52, while illustrated as a single unit, may include one or more hardware devices.

System control circuit 16 includes an interface circuit 58, which receives data from the scanner control circuit 14 and transmits data and commands back to the scanner control circuit 14. The interface circuit 58 is coupled to a control and analysis circuit 60 which may include a CPU in a multi-purpose or application specific computer or workstation. Control and analysis circuit 60 is coupled to a memory circuit 62 to store programming code for operation of the MRI system 10 and to store the processed image data for later reconstruction, display and transmission. The programming code may execute one or more algorithms capable of performing, by way of example, non-Cartesian imaging sequences and processing sampled image data (e.g., blades of data, undersampled data, fluid attenuated data), which will be discussed in detail below. An additional interface circuit 64 may be provided for exchanging image data, configuration parameters, and so forth with external system components such as remote access and storage devices 18. Finally, the system control and analysis circuit 60 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control and analysis circuit 52 associated therewith produce magnetic fields and radio frequency pulses in a controlled manner to excite and encode specific gyromagnetic material within the patient 26. The scanner 12 and control and analysis circuit 52 also sense the signals emanating from such material and create an image of the material being scanned. In certain embodiments, the scan may include fast spin echo (FSE) scan, gradient echo (GRE) scan sequences, and the like. It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed.

Specifically, aspects of the present disclosure include methods for acquiring magnetic resonance data and processing of such data to construct one or more motion-corrected images. At least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the acquisitions described herein, the system 10 may simply store the acquired data for later access locally and/or remotely, for example in a memory circuit (e.g., memory 62). Thus, when accessed locally and/or remotely, the acquired data may be manipulated by one or more processors contained within an application-specific or general purpose computer. The one or more processors may access the acquired data and execute routines stored on one or more non-transitory, machine readable media collectively storing instructions for performing methods including the motion detection, image processing, and reconstruction methods described herein.

To facilitate presentation of certain of the embodiments described herein, example acquisition and reconstruction sequences are described below. However, the present disclosure not limited to such acquisitions and sequences, unless explicitly stated otherwise.

In certain embodiments, 2D MR images are generated from Cartesian k-space, using either gradient-echo (GRE) or fast spin echo (FSE) pulse sequences, and acquired with RF receiver coil arrays of 8 or more coils. Each of the coils has a corresponding sensitivity to RF signals generated during acquisition, and the sensitivity of each coil may be mapped to generate sensitivity maps for the coil array. Image reconstruction may involve the generation of a partial image corresponding to each coil by 2D Fourier transformation of the data obtained by a particular coil (referred to as "coil data"), and multiplication by the conjugate of the coil's sensitivity map. To generate a full image, these partial images are summed and the result divided by the sum of squares of the coil sensitivity maps to give the final image.

When a patient moves during the scan, the coil data may contain a mixture of Fourier components from two or more motion states. Motion states, as discussed herein, may also be referred to herein as "poses." In particular, a pose as disclosed herein is intended to denote a position of the subject being imaged that corresponds to the portion of k-space being acquired at a given time (or time step, as described below). When two or more motion states or poses occur, the resulting reconstructed image is corrupted and contains motion-related artifacts. One aspect of the present disclosure involves detecting the presence of motion and identifying the time during the scan at which it occurred. In accordance with certain disclosed embodiments, this motion detection may be performed after the scan has been completed or may be performed during the scan.

Figure 2:
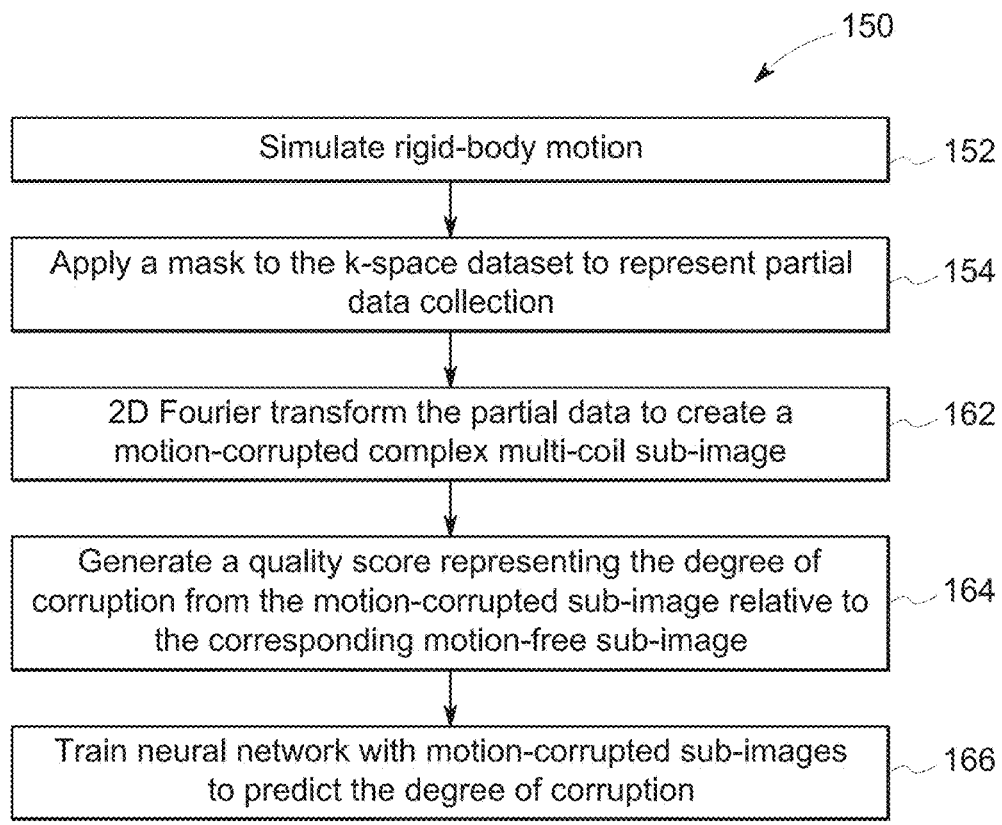
FIG. 2 is a process flow diagram of an embodiment of a method for training a neural network using motion-corrupted images to detect motion during scans.

Disclosed embodiments include methods and systems for generating a neural network trained to identify the presence and severity of motion during an MR scan. FIG. 2 depicts a process flow diagram of an embodiment of a method 150 for training a neural network using motion-corrupted images to detect motion during scans. Generally, the method 150 involves the production of training data using a training data generation process, and at least a portion of the training data is used to train a neural network, such as a convolutional neural network, to generate a prediction relating to the presence and extent of motion occurring between time steps using only a sub-image (e.g., either motion-corrupted or motion-free) as an input. As an example, for training, both motion-corrupted sub-images and motion-free sub-images may be used as training inputs so the network learns to distinguish the two. The motion-free sub-image may be treated as a motion-corrupted image whose simulated parameters are "0 translation, 0 rotation." The method 150 may be performed completely or in part, for example, by computing elements of the MRI system 10, or another specially-programmed computing system and may therefore be considered a computer-implemented method.

As shown, to generate training data, the method 150 includes simulating (block 152) motion, for example rigid-body motion. In particular, the operations of block 152 start with a motion-free image and may involve translating and/or rotating it in a controlled manner such that the timing of the motion, as well as the nature of the motion, is known. This results in an offset image. The acts of block 152 may be performed once, or a number of times by applying different translations and/or rotations to generate a plurality of offset images whose timing and motion states are known.

The resulting offset image is converted into k-space data (motion state 2 k-space data) and combined with the k-space data (motion state 1 k-space data) of the original pre-motion image, for example according to a scan order that describes how k-space was filled via phase encodes as a function of time step for the pre-motion image. For example, the combination may involve replacing some sections of k-space of the original image with the k-space data of the offset image based on the order of k-space filling and the timing of the simulated motion. Further, converting the original and offset images into k-space may involve multiplying the images by coil sensitivity maps and Fourier transforming the image data into k-space.

The k-space dataset produced by the acts of block 152 therefore simulate an entire k-space dataset that would be obtained if a scan were performed where the subject being imaged had moved between two poses. These steps may be repeated to create images with more poses, such as three or more poses. It should be noted that this data may, in certain embodiments, constitute training data for a neural network (NN), such as for a NN that identifies fully acquired datasets and identifies the presence and severity of motion. However, to more accurately represent the data collected during a scan (not simply after a scan), and to enable a trained NN to make predictions during a scan, in this embodiment the data is further processed before being used as training data.

In the illustrated embodiment, the method 150 includes applying (block 154) a mask or window to the combined k-space dataset (the k-space dataset including motion) to represent partial data collection. In certain embodiments, the mask or window is configured to isolate at least two adjacent time steps of the scan order of the data acquisition. As may be appreciated, isolating at least two adjacent time sets may allow a determination as to whether motion occurred between the time steps (e.g., between shots), as each time step may be considered immune to the effects of subject motion. In particular, the time scale for acquiring each shot is much smaller compared to the time scale between each shot, such that motion is considered to always occur between shots. Further, it should be noted that the neural networks of the present embodiments may be trained to predict motion scores for just a single k-space scan order pattern, coil configuration, and/or image resolution, or trained to predict motion scores for multiple scan patterns, coil configurations, and resolutions.

Figure 3:
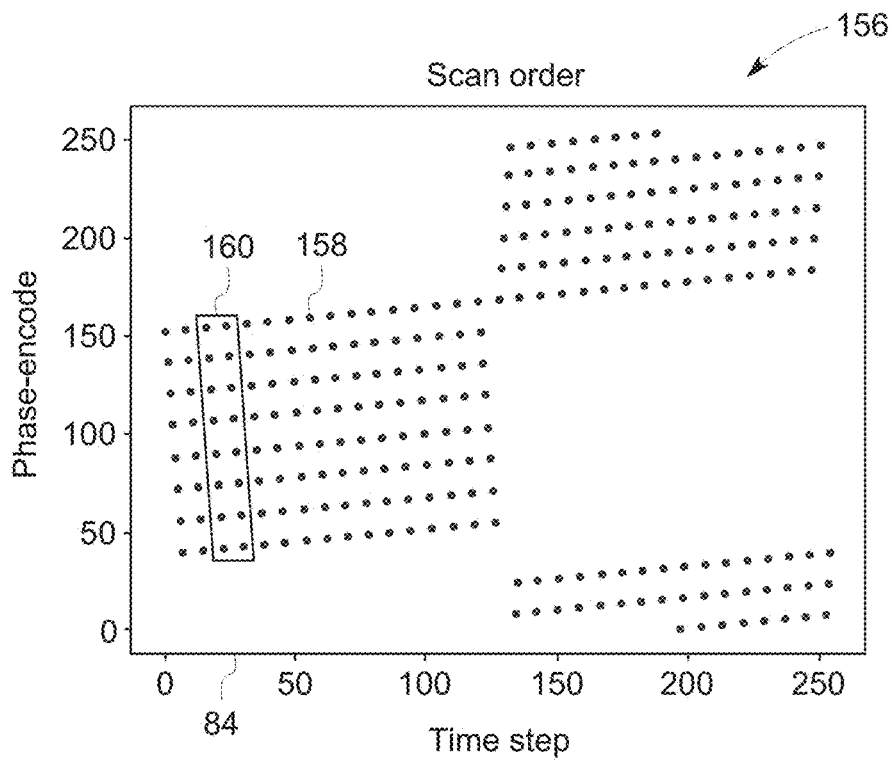
FIG. 3 is an example fast spin echo (FSE)-like scan order with phase encode as a function of time step.

To help illustrate an example of the application of a mask in the manner represented by block 154, FIG. 3 depicts an example fast spin echo (FSE)-like scan order 156 with phase encode as a function of time step. In the illustrated embodiment, k-space is filled in by interleaving multiple shots across k-space, with each shot having an echo-train length (ETL) of 8. Thus, when creating a "sub-image" from partial data, typically two successive shots are combined, representing 6% of k-space for the depicted scan order.

More specifically, as shown in FIG. 3, each dot represents a phase encode, e.g., 158 (an echo), with the readout direction being orthogonal to the page. Each angled column of phase encodes represents the phase encodes produced from a single shot. Thus, in the illustrated embodiment, the echo train length is 8. Adjacent angled columns represent time step adjacent shots. Thus, in the illustrated embodiment, a mask 160 applied to the scan order 156 may window two adjacent shots, with 8 phase encodes per shot. Because each shot can be processed to produce an image, adjacent shots are windowed so that successive partial images may be created for training or evaluation purposes to identify and characterize motion. In this example, the mask 160 is used to create partial k-space data from shot numbers 3 and 4.

It should be noted that k-space scan order of FIG. 3 is merely an example of a pattern, and other scan order patterns may be used in accordance with present embodiments. For example, a "linear" pattern where k-space gets filled in from top-down instead of in shots that have multiple k-space lines spread-out may be used to train a neural network according to the method 150. However, when trained with a linear pattern, the results produced by the trained neural network are not as accurate as those obtained using a multi-shot scan order as shown in FIG. 3.

Figure 4:
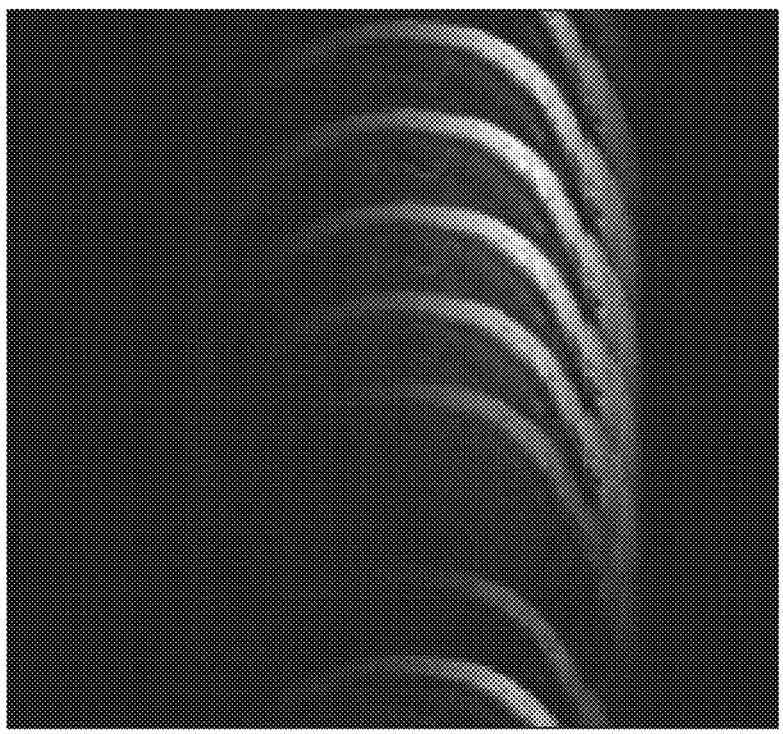
FIG. 4 is a motion-free sub-image produced from an undersampled k-space dataset.
Figure 5:
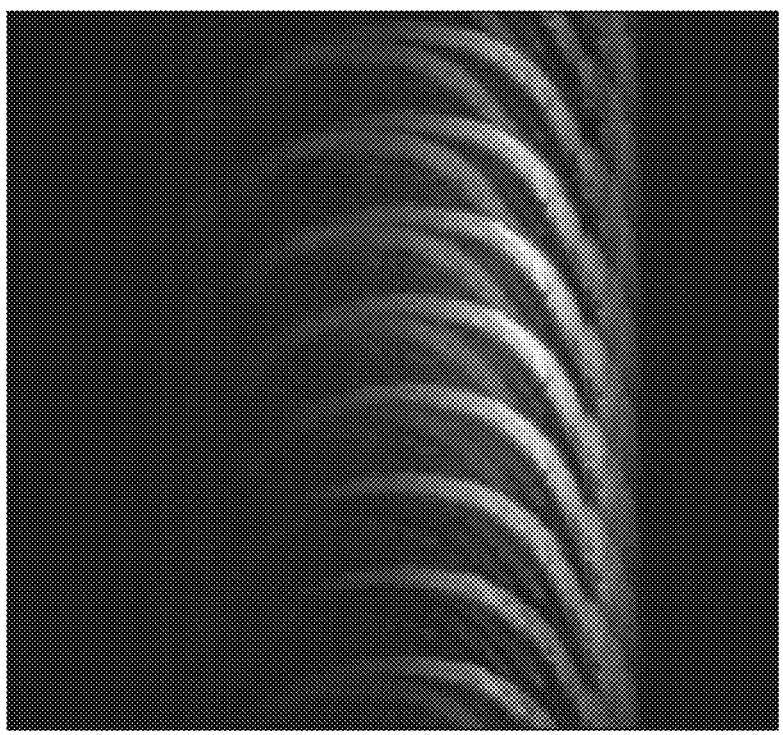
FIG. 5 is a motion-corrupted sub-image produced from an undersampled k-space dataset.

The method 150 further includes applying (block 162) a 2D (inverse) Fourier Transform to the partial data to create a motion-corrupted complex multi-coil sub-image. FIGS. 4 and 5 provide a comparison between motion free (FIG. 4) and motion-corrupted (FIG. 5) sub-images. In particular, FIG. 4 is an example of a sub-image that includes aliasing because the k-space dataset is undersampled. However, there is no motion corruption. In FIG. 5, the sub-image includes aliasing from undersampling as well as motion corruption. While the difference in the images depicted by FIGS. 4 and 5 are readily apparent to the average human observer, and a trained observer would recognize the beginnings of the ghosting artifact characteristic of motion-corrupted images in FIG. 5, it should be appreciated that the present embodiments can also identify and characterize motion in much more complex situations, for example as shown in the motion-free sub-image of FIG. 6, and the motion-corrupted sub-image of FIG. 7.

Using the motion-corrupted sub-images and the motion-free sub-images, the method 150 involves generating (block 164) a quality score representing the degree of corruption from the motion-corrupted sub-image relative to the corresponding motion-free sub-image. For example, in one embodiment, the score calculated in accordance with block 164 may be a score based on the average entropy of the difference in the two sub-images. In such an embodiment, a motion-free image would have a score of 0, and the score would increase with severity of the motion artifact. Further, basing the score on the average entropy of the difference between the two images for each coil (motion-free and motion-corrupted), the score for different motion corrupted images produces a gaussian distribution when there is motion that corresponds to the severity of the motion corruption. In other words, the severity of the motion corruption may be more closely related to the magnitude of the score.

In certain embodiments, the score may be calculated according to the following equations:

$$\Delta = \frac{|I_{Motion} - I_{Truth}|}{I_{Truth,Max}} \qquad \text{Equation 1}$$

$$S_{coil} = -\sum_{pixels} \Delta \log \Delta \qquad \text{Equation 2}$$

$$S = \sum_{coil} \frac{S_{coil}}{W_{coil}} \qquad \text{Equation 3}$$

Equation 1 represents a normalized difference between two sub-images, where $I_{Motion}$ is a pixel value for the motion-corrupted sub-image, $I_{Truth}$ is a pixel value for the "ground truth" or corresponding motion-free sub-image, and $I_{Truth,Max}$ is a maximum pixel value for the motion-free sub-image.

Equation 2 calculates the coil entropy, $S_{coil}$, of the difference corresponding to the two sub-images (motion-free and motion-corrupted) for a particular coil. In particular, $S_{coil}$ is the negative of the sum, over all the pixels of the sub-images corresponding to a particular coil, of the difference multiplied by the log of the difference. While the difference itself may be used to calculate a score, it has been found that the use of the log term provides a distribution for the score that more closely correlates to the severity of the motion corruption.

Once the coil entropy is calculated, in certain embodiments coil entropies may be combined according to Equation 3, which is a weighted sum of the coil entropies calculated for all the coils to obtain the final score. In this way, the entropy metric sums over pixels (using Equation 2) and coils (using Equation 3). It should be noted that the score calculation may be different, in certain embodiments. For example, in other embodiments, a natural log of the difference instead of the entropy of the difference may be used for score calculation. Further, in some embodiments, to make the neural network and score calculation compatible with different image resolutions (e.g., 256×256, 244×244, 312×321), rather than using the sum of the per-pixel entropy of the difference for scoring, the average may be used. Thus, because multiple outputs may be combined in some embodiments, the disclosed embodiments may use the sum of all pixels over all coils, the sum per coil, the average over all pixels and coils, and the average per each coil. It should be noted that the resulting motion score will therefore have a number that may range between 0 and 1 (e.g., where the score is an average), or a number that ranges much higher (e.g., where the score is a sum). In some embodiments, alternative metrics such as normalized mean squared error may be used as the quality score. Other embodiments may use metrics such as the weighted sum or the log of the weighted sum of 1) the difference, 2) the entropy of the difference, or 3) the log of the difference.

To help illustrate the efficacy of the motion scoring described with respect to block 164, using Equations 1-3, scores were calculated for images having varying degrees of motion corruption. FIGS. 8, 9, 10, and 11 depict example motion-corrupted images and the score associated with each image. In these images, the score was calculated as a sum of the per-pixel entropies, and has scores ranging up to 7000. As illustrated by these images, the images that are almost motion-free have a quality score on the lower end of the scoring spectrum (<2000), while images with severe corruption are on the higher end of the scoring spectrum (>3000).

Returning to the method 150 of FIG. 2, once the quality scores are generated for the various sub-images in accordance with block 164, a neural network is trained (block 166) to predict the degree of motion corruption for various images—specifically by predicting a score for combined sub-images. As an example, the neural network may be a "deep learning" neural network, meaning that it includes multiple layers. Training the neural network in accordance with block 166 may include providing a large number (e.g., thousands) of both motion-free and motion-corrupted sub-images to predict the degree of corruption. Indeed, the various outputs of the operations performed as a part of method 150, up to block 166, may be used as training and/or validation data for training and validating the neural network. The neural network may be trained according to block 166 using images resulting from random translations and rotations, combinations of adjacent shot pairings, and a variety of ETLs.

In certain embodiments, the neural network trained according to block 166 may be a convolutional neural network (CNN) having one or more convolutional layers, one or more max pool layers, one or more flattening layers, one or more fully connected layers, or any combination thereof. One embodiment of a CNN 180 trained to predict a motion score from sub-images is shown in FIG. 12.

Figure 12:
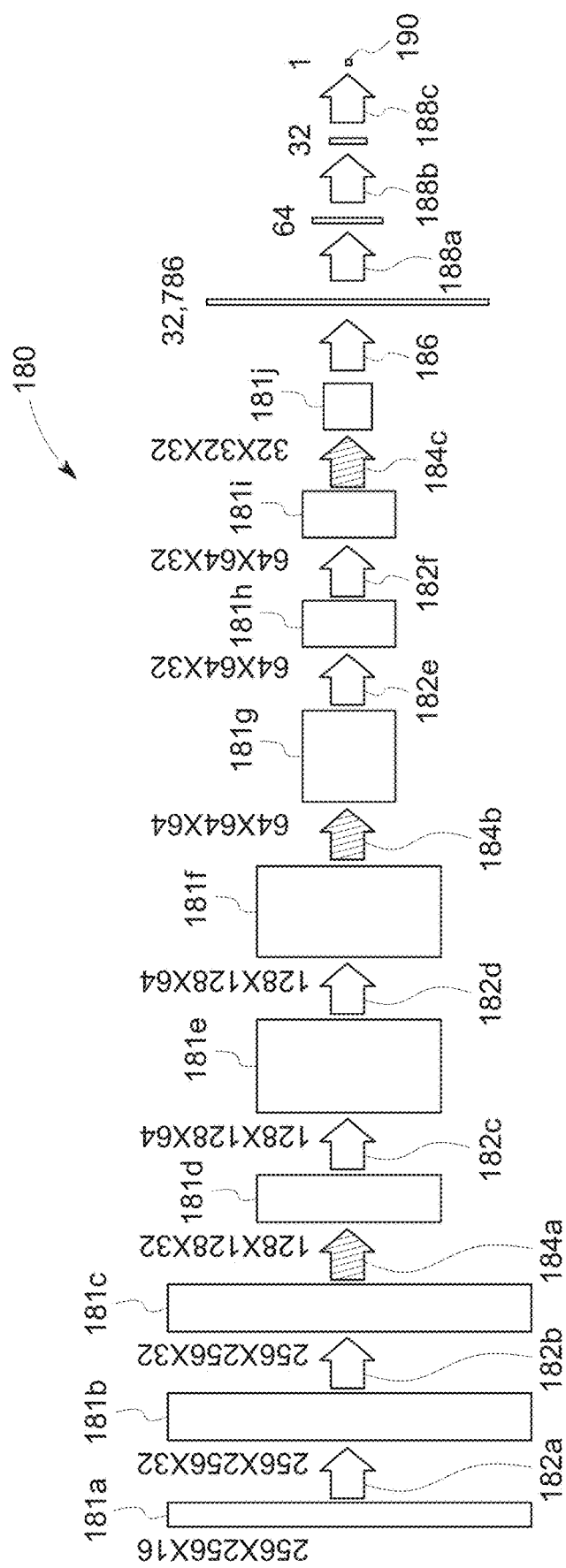
FIG. 12 is a schematic representation of an embodiment of a convolutional neural network (CNN) configured to predict a motion score from an input sub-image.

In the representation of FIG. 12, the data is shown in the form of multi-dimensional inputs 181, such as (256×256× 16) for the leftmost data set. This is because the CNN 180 treats images as multi-dimensional tensors, or stacked matrices. For example, moving from left to right in FIG. 12, the data begins with a sub-image itself 181a, which is the 256×256, or 256 pixels by 256 pixels. The 16 of the 256×256×16 is representative of the number of channels for the image. In particular, the 16 represents the number of coils used to produce the image, 8 in this embodiment, multiplied by two channels per coil due to the data being complex (including real and imaginary data). Thus, the 256×256×16 represents a matrix that is 256×256 (corresponding to the pixels) and has a nested array of 16 values per pixel. For systems that employ varying numbers of coils, data may instead have a different number of channels. Such embodiments are described in further detail later.

Figure 6:
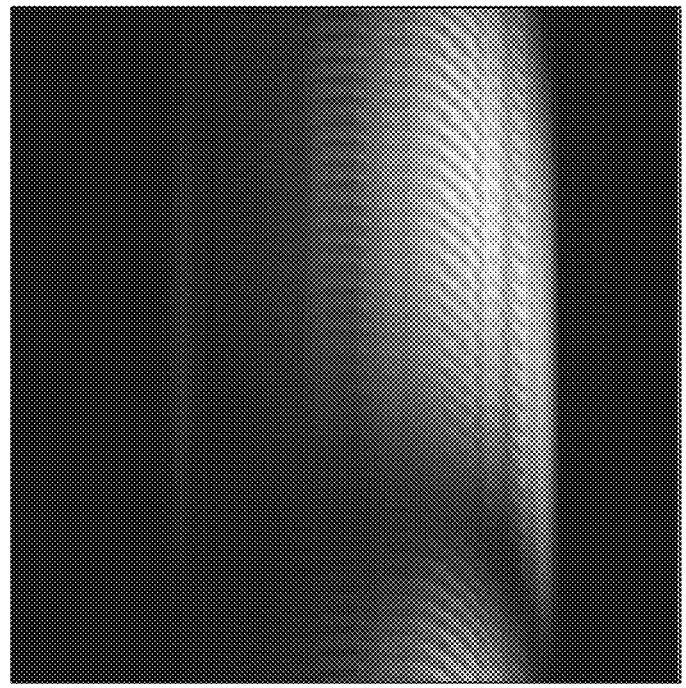
FIG. 6 is a motion-free sub-image produced from an undersampled k-space dataset.
Figure 7:
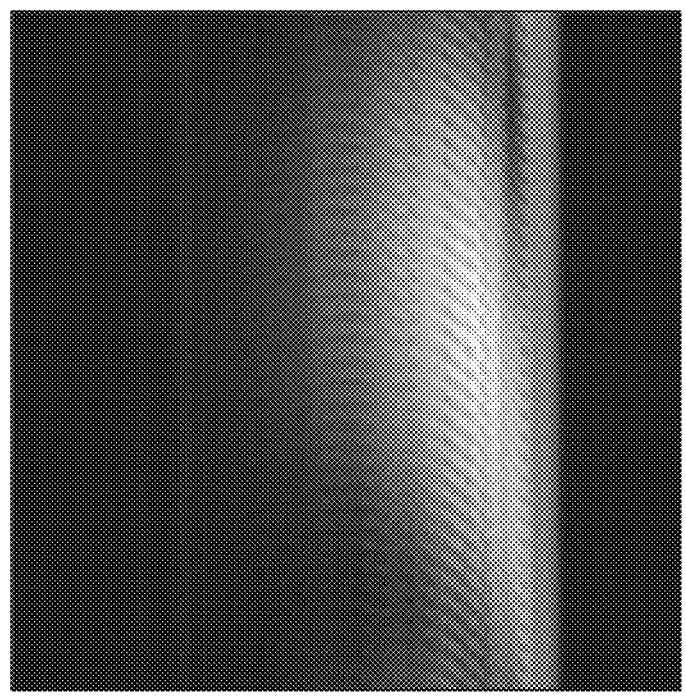
FIG. 7 is a motion-corrupted sub-image produced from an undersampled k-space dataset.
Figure 8:
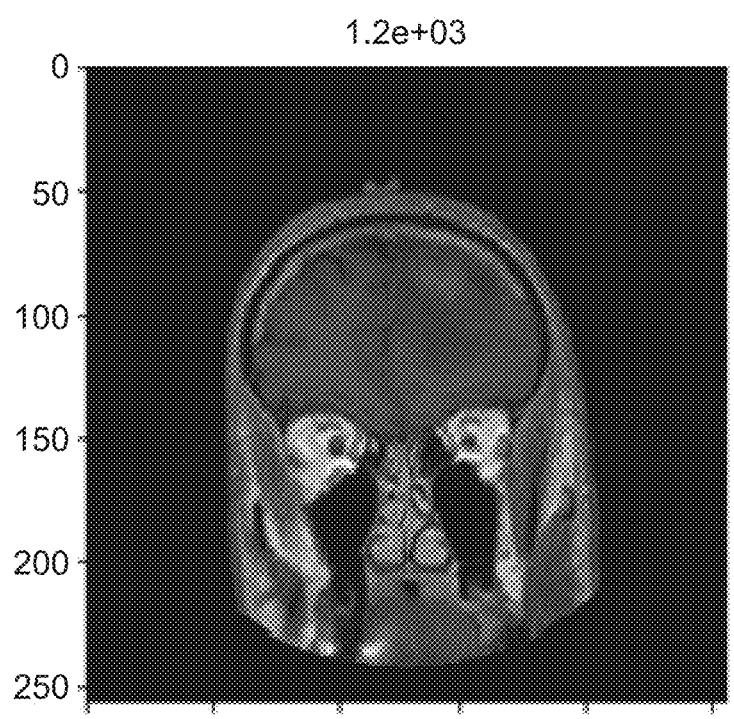
FIG. 8 is an example relatively motion-free image having a relatively low motion score.
Figure 9:
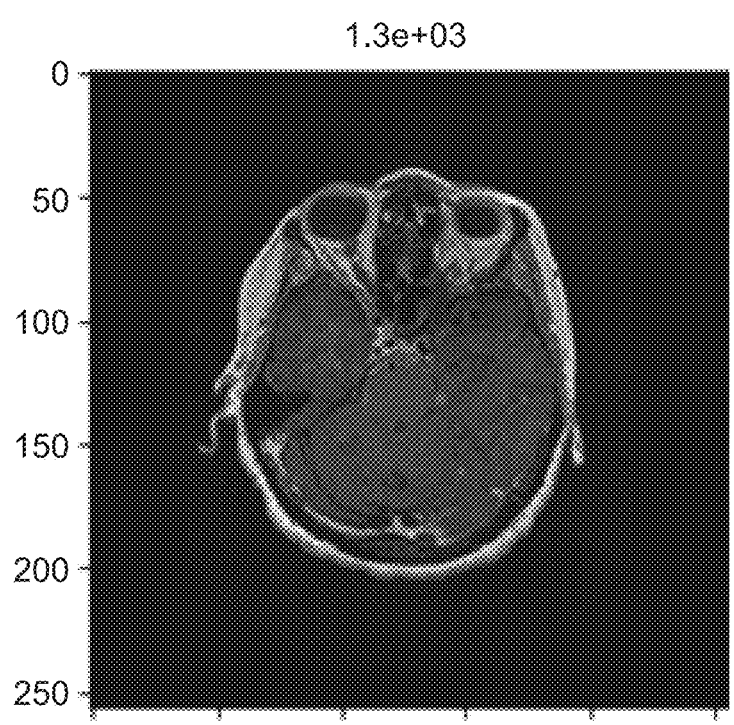
FIG. 9 is another example relatively motion-free image having a relatively low motion score.
Figure 10:
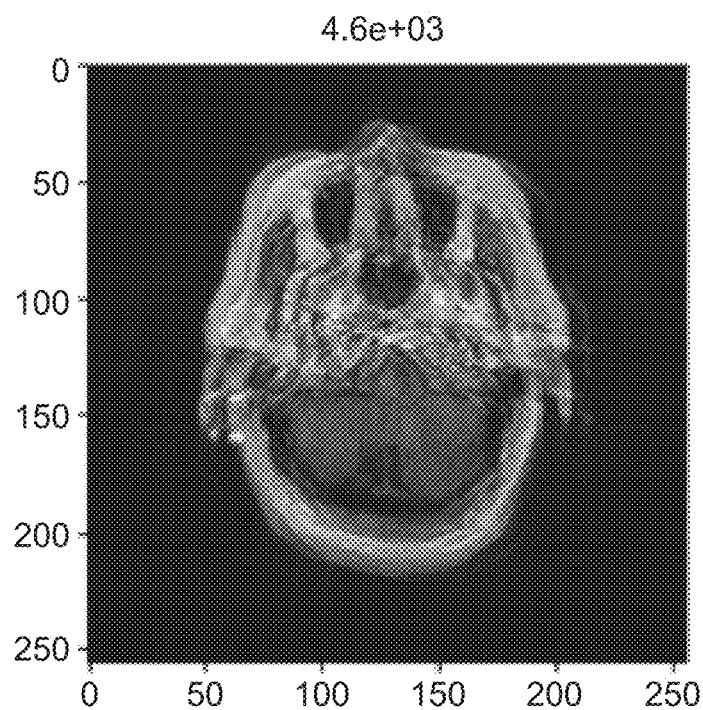
FIG. 10 is an example motion-corrupted image having a relatively high motion score.
Figure 11:
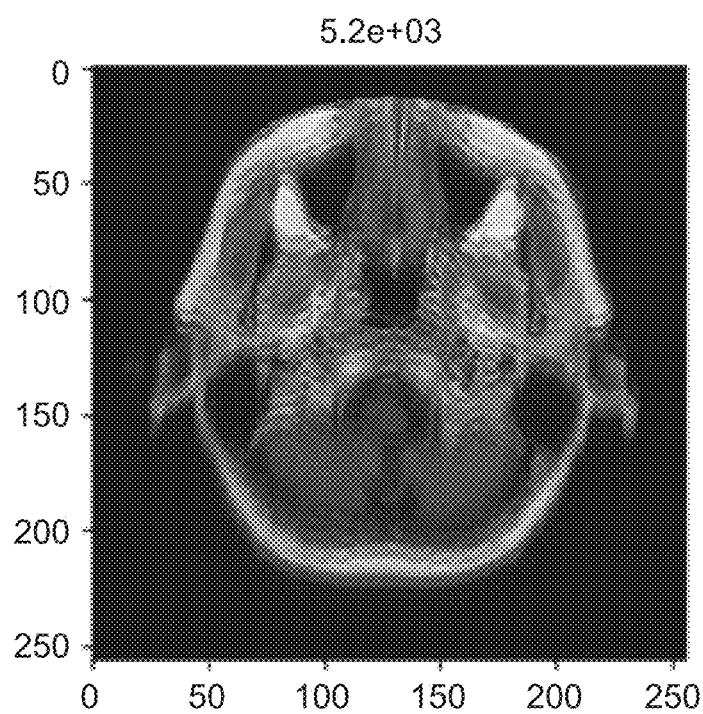
FIG. 11 is another example motion-corrupted image having a relatively high motion score.

The input volume to the CNN 180 is the raw pixel values for the image over all 16 channels, in this case 256 pixels wide by 256 pixels high by 16 channels. The image is a combined sub-image generated from Fourier transformation of two adjacent shots (outlined, e.g., by window 160 in FIG. 3). A resulting sub-image (e.g. as shown in FIGS. 6, 7) would be produced by Fourier transformation of the windowed data, with the remainder of k-space zero-filled, and fed into the CNN as input volume 181a, in FIG. 12.

A first convolutional layer 182a operates on this input 181a using a window (i.e., trainable filter or kernel) followed by a non-linear activation function (e.g., a leaky rectified linear unit (ReLU) activation function). In one embodiment, the window may have a size of 3×3 though other window sizes may be used. The stride of the window may be 1, meaning that the window is slid by one pixel in one direction, or may be more than one, meaning that the window is slid by more than one pixel in one direction. The number of features may be 32, or may be other than 32. The output of the first convolutional layer 182a is second data 181b, which is a 256×256×32 set of data.

A second convolutional layer 182b, which also uses a window (trainable filter or kernel) and a non-linear activation function, is applied to the second data 181b to generate third data 181c, which is also a 256×256×32 set of data. The third data 181c is input to a first max pool layer 184a, which is configured to downsample the data. In particular, the first max pool layer 184a downsamples the third data 181c along the spatial dimensions (width and height) by applying a small window (e.g., 2×2) with a corresponding stride (e.g., stride 2) to each 256×256 matrix and retaining only the maximum value falling within the window. Thus, fourth data 181d output by the first max pool layer 184a includes a smaller data set 128×128×32.

This pattern (two convolutional layers 182 followed by a single max pool layer 184) is repeated twice to produce fifth, sixth, seventh, eighth, ninth, and tenth data 181e, 181f, 181g, 181h, 181i, and 181j. However, the convolutional layers 182 and the max pool layers 184 are not the same, nor do they necessarily apply the same types or number of filters. In the illustrated embodiment, tenth data 181j is a 32×32×32 dataset, which is subjected to a flattening layer 186.

The flattening layer 186, as shown, flattens the multidimensional dataset into a single dimensional set of values, in this case 32,768 values. First, second, and third fully connected layers 188a, 188b, and 188c each include nodes that are fully connected to all activations in a previous layer. The fully connected layers 188a, 188b, and 188c may act as classifiers, and as shown are layered to eventually provide an output of a single value, which is a motion score 190 for the sub-image 181a.

While the CNN 180 of FIG. 12 is shown as including a particular pattern of convolutional layers 182, pool layers 184, and fully connected layers 188, it should be noted that the techniques described herein are not limited to the particular pattern shown. While the particular pattern shown in FIG. 12 has been found to produce more accurate results compared to other patterns, other embodiments of the CNN 180 may use different numbers of the layers, in different orders, and for a different number of sequences depending on the inputs received. Indeed, any combination of convolutional layers 182, pool layers 184, fully connected layers 188, and other operations may be combined in a particular manner, and trained, to produce a motion score as described herein—though some patterns may produce a more accurate motion score compared to others.

The CNN 180 of FIG. 12 is configured to ingest a sub-image 181a produced from data obtained by a plurality of coils (all the coils of the receiving array), and to predict the image score 190 accordingly. However, it should be noted that different MR imaging systems may include different numbers of coils. To provide for a system that is compatible with different numbers of coils, in certain embodiments, the CNN 180 may be trained to ingest an image from a single coil, and to produce a corresponding motion score for each coil sub-image. Taking the example illustrated in FIG. 12, for instance, where a sub-image from the full set of 8 coils produces a data set that is 256×256×16, a single coil sub-image for such a configuration would produce a data set that is 256×256×2, with two channels rather than 16. Again, each coil produces two channels—a real data channel and an imaginary data channel because the images are complex.

Figure 13:
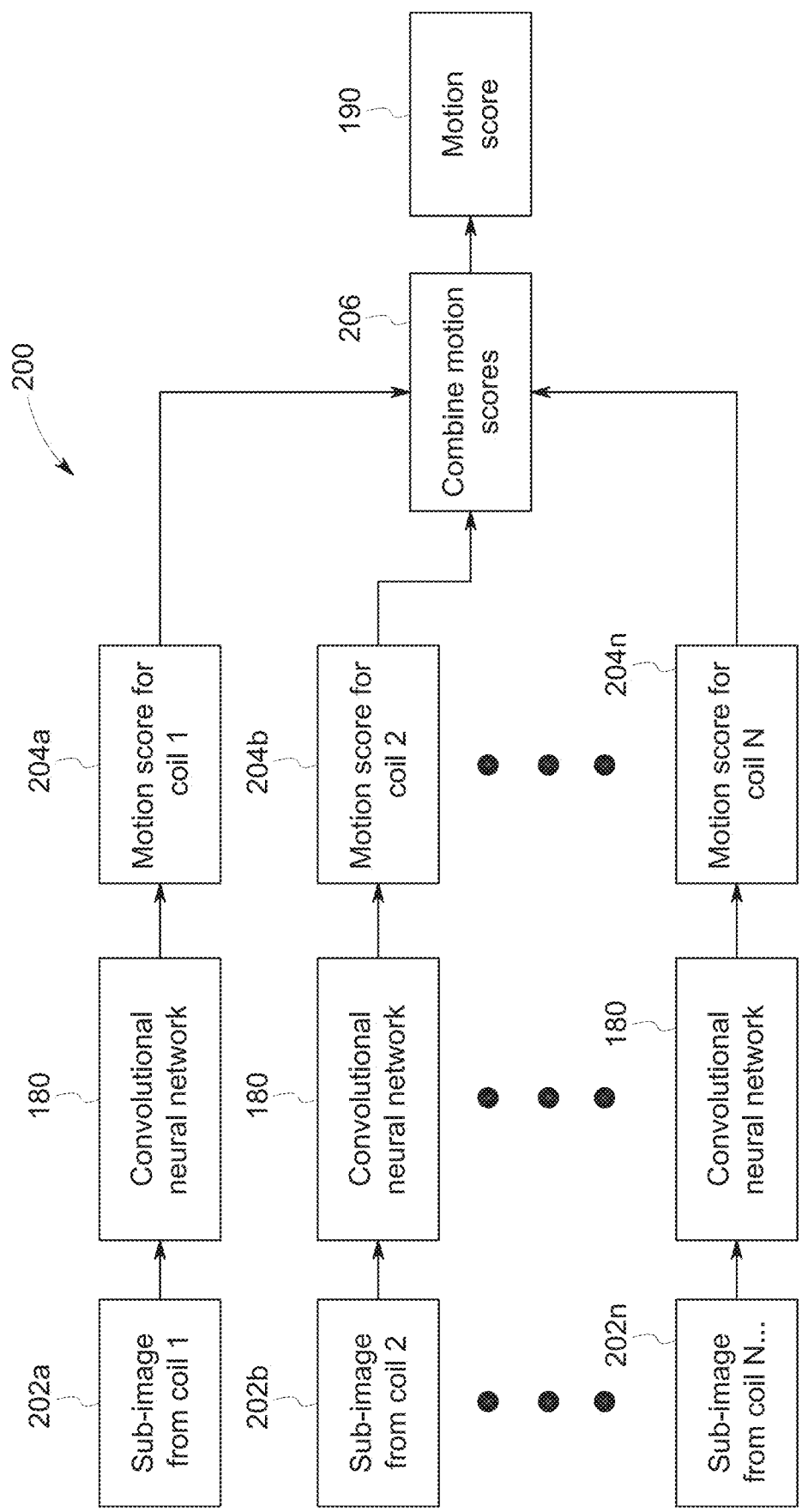
FIG. 13 is an embodiment of a method in which a CNN is configured to produce a motion score for a single coil sub-image, and multiple motion scores are combined to produce a motion score for an entire set of sub-images from multiple coils.

FIG. 13 is a schematic representation of a method 200 for producing the motion score 190 from individual coil sub-images fed into the CNN 180. In the illustrated embodiment, the method 200 begins with a sub-image from a coil 1 202a (a first coil), a sub-image from a coil 2 202b (a second coil), and other sub-images from other coils of the particular system up to a sub-image from coil N 202n (the Nth coil), where N is the total number of coils of the MR imaging system. Each coil sub-image 202 is separately fed into an embodiment of the CNN 180 (e.g., as a 256×256×2 data set). Again, the coil sub-images 202 correspond to images produced from data obtained from only a portion of k-space, for instance data obtained from two successive shots.

The CNN 180 of FIG. 13 is trained to produce a corresponding motion score for each coil sub-image 202. Thus, in the method 200 of FIG. 13, the CNN 180 separately outputs a motion score for coil 1 204a, a motion score for coil 2 204b, and so forth up to a motion score for coil N 204n.

The single-coil motion scores 204 are combined via a score combination operation 206 to produce the motion score 190 for the entire data set. The combination operation 206 may involve a weighted sum of the single-coil motion scores 204, an average of the single-coil motion scores 204, or some other combination operation. Thus, the method 200 shown in FIG. 13 may be performed in situations where flexibility is desired in the prediction from the standpoint of the number of coils used by the MR system (e.g., system 10).

Figure 14:
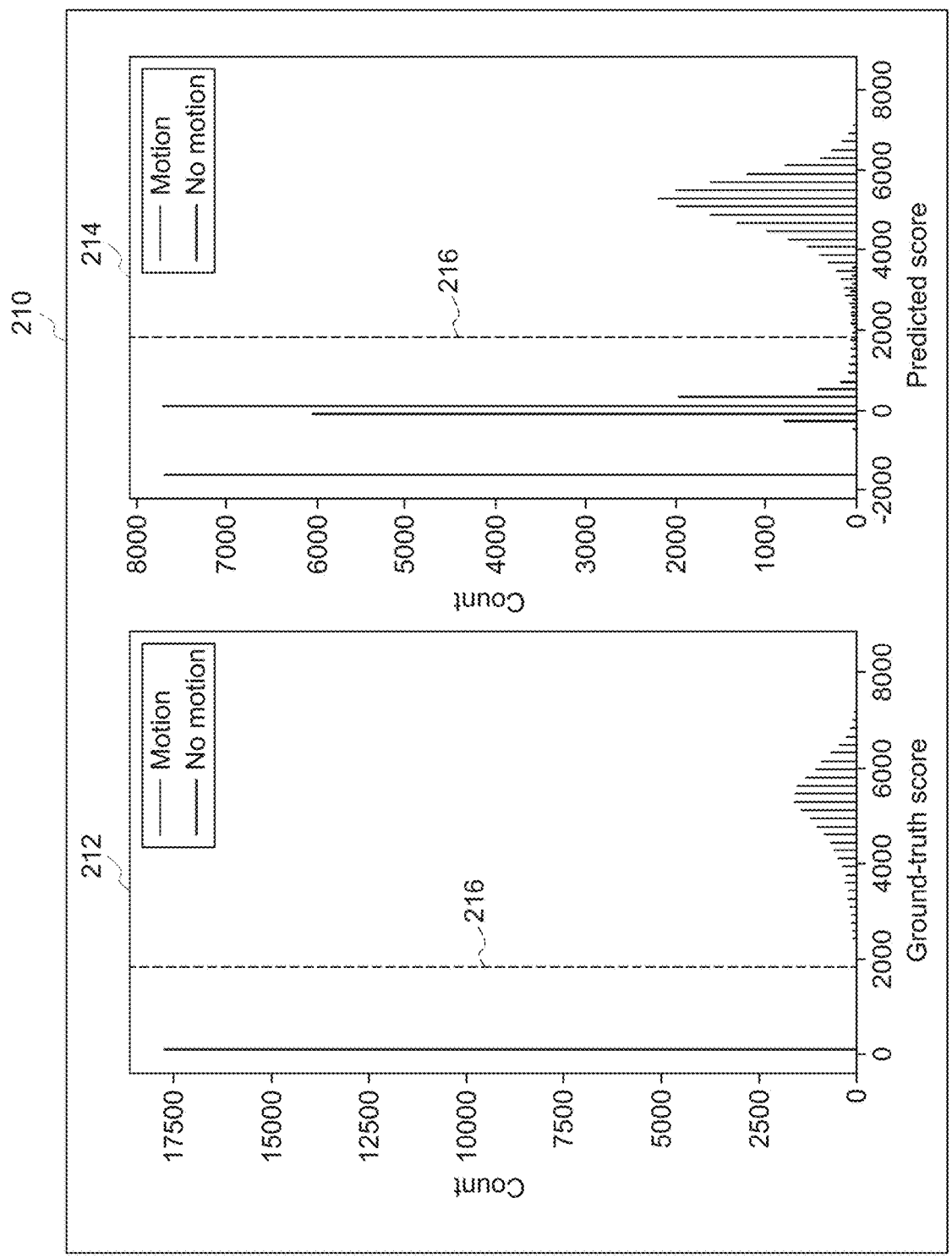
FIG. 14 is a comparison between a first histogram of ground truth scores for a set of sub-images, and a second histogram of neural network-generated scores for the same set of sub-images.

The efficacy of the CNN 180 of FIG. 12 was tested on a sample set of data, as shown in FIG. 14, which is a comparison 210 between a first histogram 212 of ground truth scores for a set of sub-images, and a second histogram 214 of network-generated scores for the same set of sub-images.

The first histogram 212, more specifically, is a population of calculated motion-corruption scores for 6% of k-space filled-in, indicating presence and extent of motion artifact. The second histogram is a population of neural network predictions of the score using only the sub-images as input. As shown by line 216 in both histograms, by choosing an appropriate threshold, the network prediction becomes a classifier determining whether motion occurred in the sub-image or not. Once motion is determined to have occurred, the network prediction can further be used to determine if the motion was significant (i.e., whether motion that resulted in a significant amount of motion artifact occurred).

Figure 15:
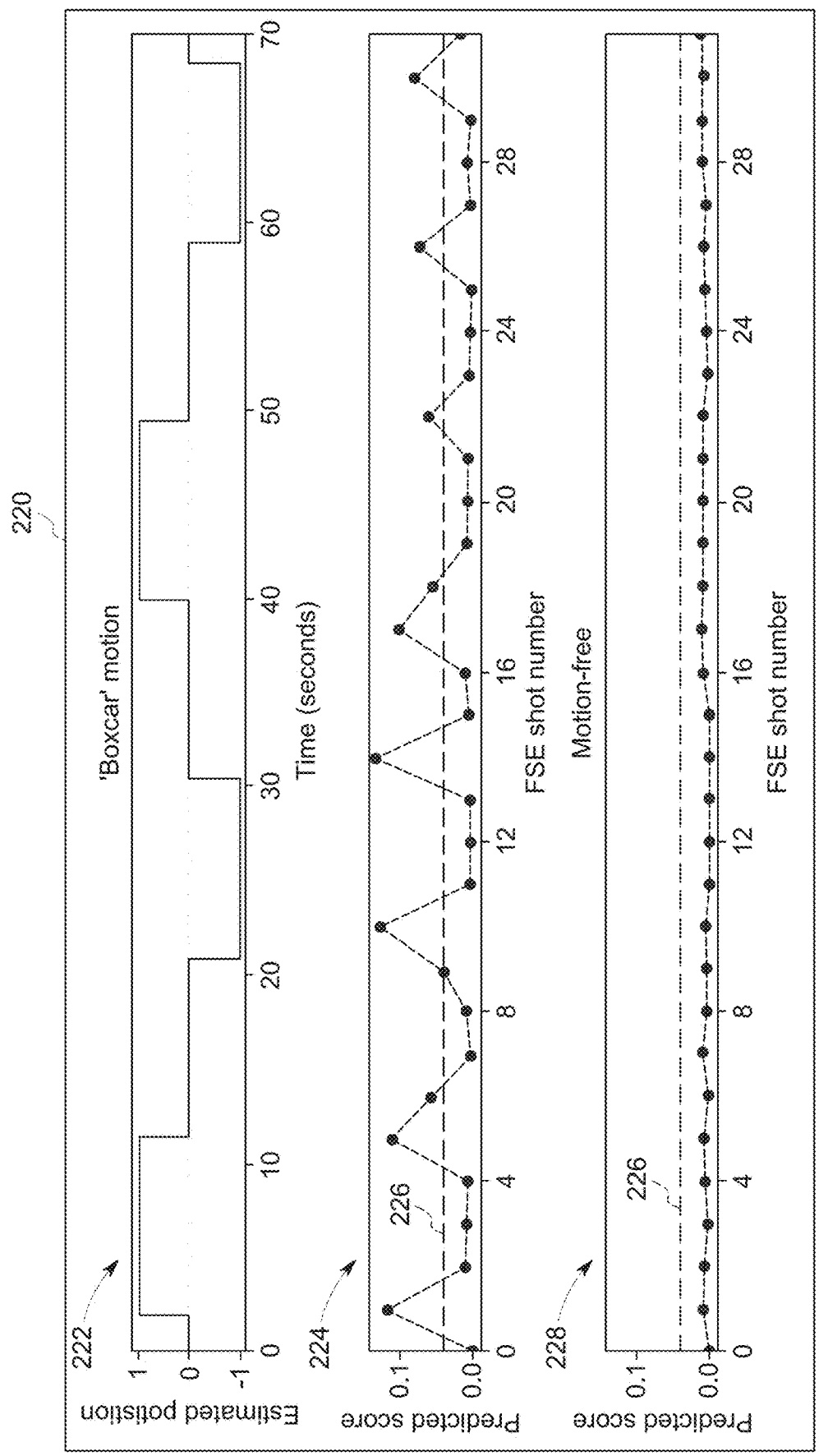
FIG. 15 is a comparison between a motion profile of an imaged subject, a predicted motion score profile based on sub-images generated during imaging while the subject moved according to the motion profile, and a predicted motion score profile based on sub-images generated during imaging while the subject remained relatively motionless.

The ability of the CNN 180 of FIG. 12 to detect the timing of motion was also tested. In particular, FIG. 15 illustrates an example scenario 220 where an imaged subject was instructed to rotate their head back and forth at regular intervals during a T1-weighted fast spin echo (FSE) scan. Profile 222 demonstrates the approximate motion profile of the head movement. Profile 224 is a plot of the predicted motion score obtained from the CNN 180 of FIG. 12 as a function of shot number using the raw data. As shown, the predicted score jumps above a motion score threshold 226 with the onset of the motion, demonstrating that the CNN 180 was able to identify not only that motion occurred, but also identify the timing of each motion event that resulted in motion corruption.

Profile 228 is a plot of predicted score as a function of FSE shot number for a motion-free scan. As shown, the predicted motion score stays well below the motion score threshold 226, meaning that the CNN 180 correctly predicted that no motion occurred.

Figure 16:
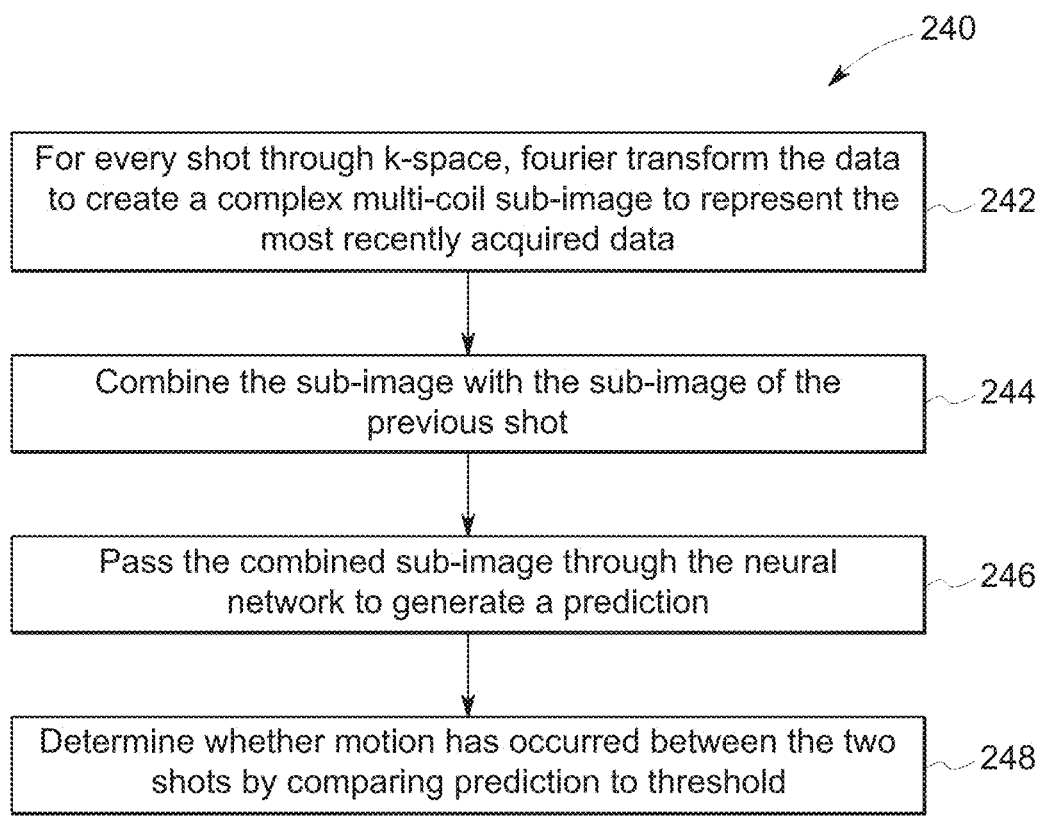
FIG. 16 is a process flow diagram of an embodiment of a method for predicting and scoring motion during a scan.

Once the neural network of the present disclosure (e.g., the CNN 180) has been trained and validated, the CNN 180 may be used during scans to predict whether motion has occurred and the effect that the motion has on the obtained data (e.g., the effect of the motion on the image that would be produced). FIG. 16 is a process flow diagram of an embodiment of a method 240 for predicting and scoring motion during a scan.

As with the other methods described herein, the method 240 may be performed using the control and analysis circuitry 52, 60 of the MR system 10, for example. In other embodiments, the method 240 may be performed by an appropriately programmed computing device having processing circuitry and memory, where the memory stores instructions that, when executed by the processing circuitry, performs the operations set forth in the method 240. Indeed, because the method 240 is performed during an MR scan, the method 240 may be performed by the same system that acquires the MR data to reduce latency in situations where the method 240 leads to some remedial action (e.g., data reacquisition).

As shown in FIG. 16, the method 240 includes, for every shot through k-space, performing a (inverse) Fourier transform (block 242) to create a complex multi-coil sub-image to represent the most recently acquired data. In certain embodiments, this may be done on a coil-by-coil basis such that a plurality of sub-images is produced as complex single coil sub-images.

The sub-image of the current shot is then combined (block 244) with the sub-image of the previous shot. Again, this may be on a multi-coil basis, or on a single coil basis. This combination of two adjacent shots allows the neural network to determine whether motion has occurred, as the motion time frame is much longer than the time frame of each shot.

Once the combined sub-image is obtained (multi-coil), or once the multiple combined sub-images are obtained (single coil), the sub-image is passed through the neural network (block 246) to generate a motion score prediction. In the case of single-coil sub-images, additional steps may be performed as discussed with respect to FIG. 13.

The motion score prediction is then compared to a threshold (block 248) to identify whether motion has occurred. For instance, the threshold may be chosen based on minimizing the false positive and/or false negative rate in the training data or a separately-generated set of validation data. As set forth with respect to FIG. 15, if the motion score is predicted to be above the threshold, then the neural network may be considered to have predicted a motion event.

In certain embodiments, since every shot's sub-image gets used twice, once as newly-acquired data and once as the "previous shot" sub-image for the next sub-image, the timing of the motion can be narrowed down to a single shot. The timing has been demonstrated to be resolved within 8 lines of a 256-line image (3% of k-space).

Once the motion has been detected and the timing is known, various actions can be taken, including restarting the scan, reacquiring those portions of k-space acquired before the movement, or correcting for the motion to reconstruct an artifact-free MRI image, using the existing data. The manner in which the effects of motion can be mitigated depends on, among other things, the time at which the motion was detected versus the time at which the motion occurred. For example, in situations where motion is not detected until after the scan has been completed, the methods available to ameliorate the effects of the motion may not be the same as those available when the motion is detected during the scan. FIGS. 17-21 detail various methods that may be performed by the MR system 10 in different motion situations.

Figure 17:
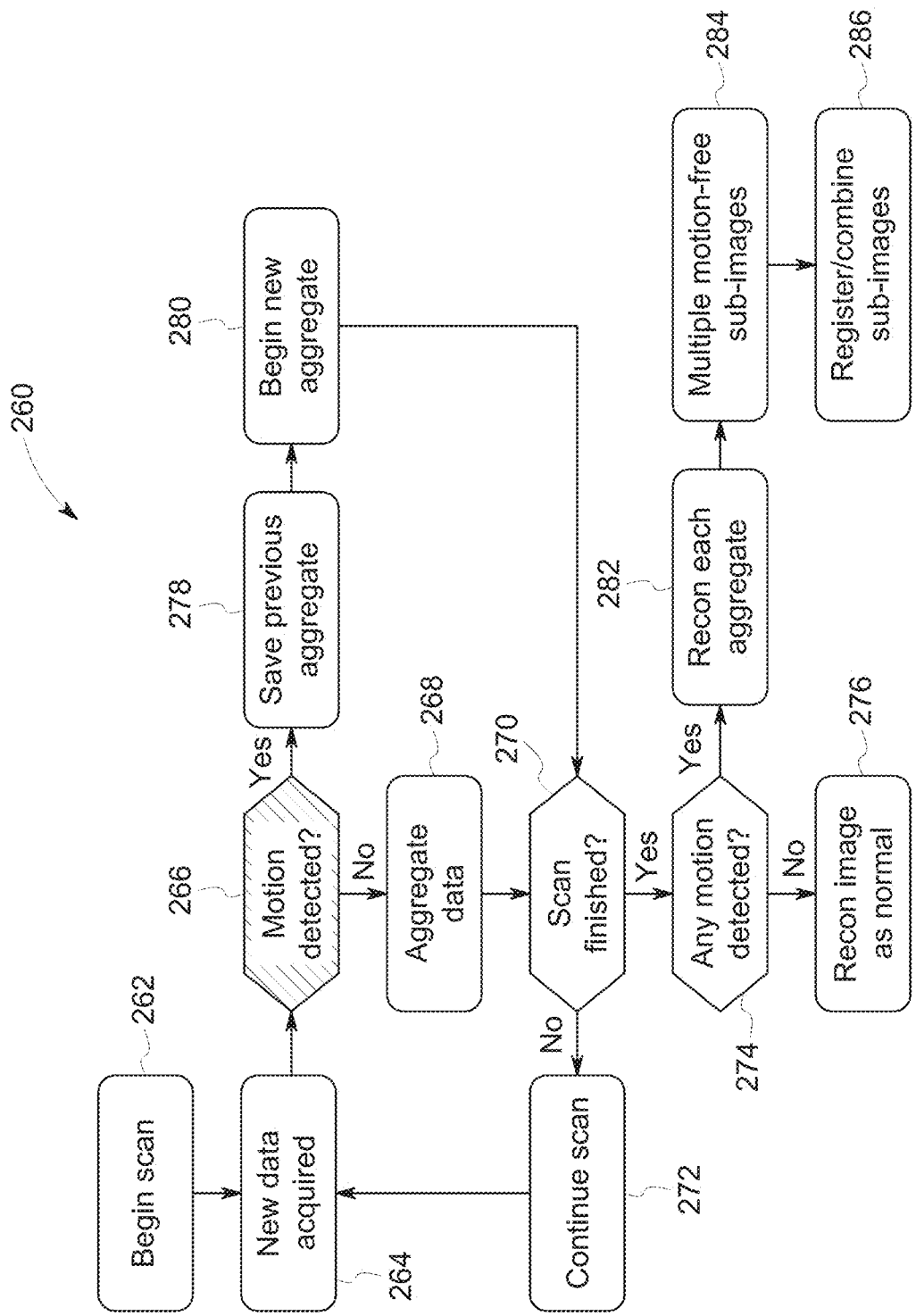
FIG. 17 is an embodiment of an algorithm for performing a scan, monitoring for motion during the scan, and aggregating motion states when motion is detected.

FIG. 17 depicts a process flow diagram of an embodiment of an algorithm 260 performed, for example, by control and analysis circuitry 52, 60 of the MR system 10 in situations where motion is detected during a scan. The algorithm 260 includes various operations, including beginning the scan at operation 262. This begins the process of acquiring new data at operation 264.

Once data has been acquired, the algorithm 260 performs a query 266 to determine whether motion has been detected using, for example, the CNN 180 of FIG. 12 to perform the method 240 of FIG. 16. If motion has not been detected in the most recent shot, the k-space data is aggregated at operation 268 with the previous k-space data, and if the scan has not finished (query 270), the scan is continued as normal at operation 272. If the scan is finished, another query 274 is performed to determine if motion has been detected and if the scan is motion-free, the image is reconstructed according to conventional techniques.

If, at query 266, motion is detected, the data previously collected is saved as one motion state at operation 278, and a new motion state is started at operation 280. The new motion state initially includes only the most recent k-space data collected. As the scan continues, k-space data will be aggregated to this motion state as long as further motion is not detected. The results of the operations described to this point result in continuing to either add to the current motion state or creating new motion states until the scan is complete.

At query 274, if there were multiple motion states, each aggregate (each set of k-space data corresponding to a single motion state) is separately reconstructed at operation 282. In this respect, each reconstructed motion state results in a motion-free sub-image and multiple motion-free sub-images 284 are produced.

At operation 286, various known techniques can be used to combine the different sub-images, or to separately reconstruct them into full images. For example, the sub-images 284 can be registered and combined to create a motion-free image, through methods known in the art. Or the k-space data from each motion state can be reconstructed using parallel imaging, compressed sensing, or a sparse-reconstruction neural network. The resulting images can then be registered and combined, through methods known in the art. As one example, operation 286 may include iterative joint estimation of motion and image, with timing constraints. The timing constraints (i.e., motion timing) are obtained based on the neural network predictions.

Figure 18:
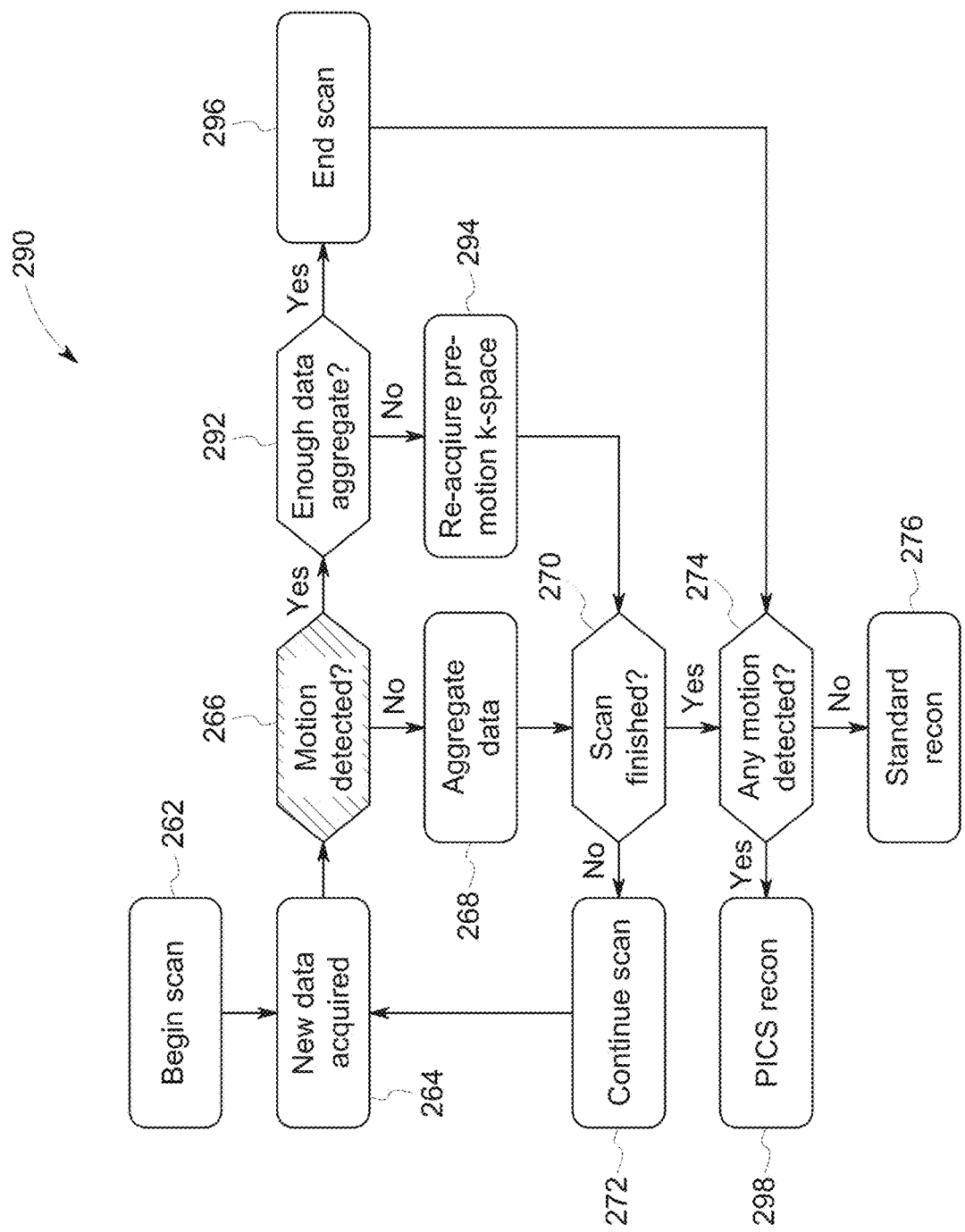
FIG. 18 is an embodiment of an algorithm for performing a scan, monitoring for motion during the scan, and aggregating a final motion state when motion is detected.

Using a similar sequence, instead of aggregating the separate motion states, the k-space data may be adaptively reacquired as shown in FIG. 18. In particular, algorithm 290 of FIG. 18 includes many of the same operations as the algorithm 260 of FIG. 17, including operations 262, 264, 268, 272, and 276 as well as queries 266, 270, and 274.

For the algorithm 290, if motion is detected at query 266, then the system (e.g., control and analysis circuitry 52, 60) determines whether enough of k-space has been filled to make possible parallel imaging/compressed sensing (PICS) or use of a sparse-image-reconstruction neural network at query 292.

If not enough of k-space has been filled, then the algorithm 290 continues to acquire data by adding data to a new motion state at operation 294. If necessary, lines of k-space filled in during previous motion states are re-acquired. Previous motion state data may be discarded or used for other purposes.

Once enough of k-space has been filled to make parallel imaging or sparse image reconstruction possible, the scan is ended at operation 296. The final image is reconstructed at operation 298 with just the portion of k-space acquired in the final motion state using one of the aforementioned reconstruction algorithms (e.g., PICS recon or a sparse-image-reconstruction neural network).

Figure 19:
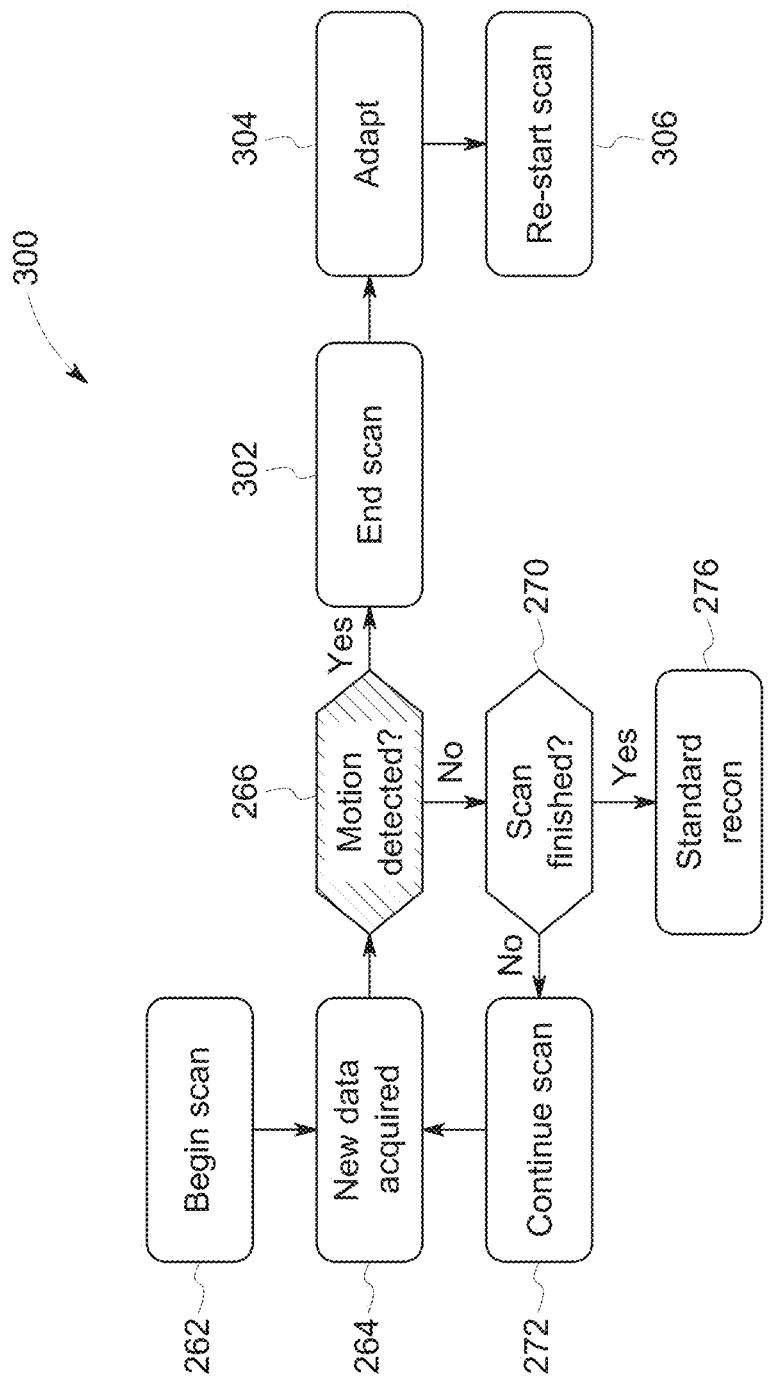
FIG. 19 is an embodiment of an algorithm for performing a scan, monitoring for motion during the scan, and adapting to the motion during the scan when motion is detected.

In certain embodiments, the detected motion may be so severe that the data is essentially unusable. FIG. 19 depicts an embodiment of an algorithm 300 that involves ending the scan early if motion is detected. For example, the algorithm 300 may include many of the operations and queries described previously with respect to FIGS. 17 and 18, except that once severe motion is detected at query 266, the scan is ended at operation 302. For example, the motion score predicted by the CNN 180 may be so high that the motion may be considered severe and the scan ended.

Ending the scan in this manner allows an operator to take adaptive actions at operation 304. For example, the operator may instruct the subject to remain still, assist the subject if remaining still is difficult, or a more motion-robust imaging sequence may be utilized (e.g., automatically chosen by the system). Once adaptive correction is performed, the scan may be re-started at operation 306.

The algorithm 300 may be used in combination with the two algorithms 260, 290 described above, by taking advantage of the fact that the motion score reflects not only the presence but also severity of motion. For instance, the scan can be ended early if severe motion is detected multiple times, but otherwise one of the other algorithms can be implemented in response to a smaller motion score. This algorithm 300 also makes use of the quality score distribution from the neural network to allow selection of a particular tolerance for motion scores. For instance, depending on the intended use for the finished scans, minor motion artifacts may not affect the diagnosis. The same neural network with a dynamic threshold allows multiple thresholds to be customized to specific applications.

Figure 20:
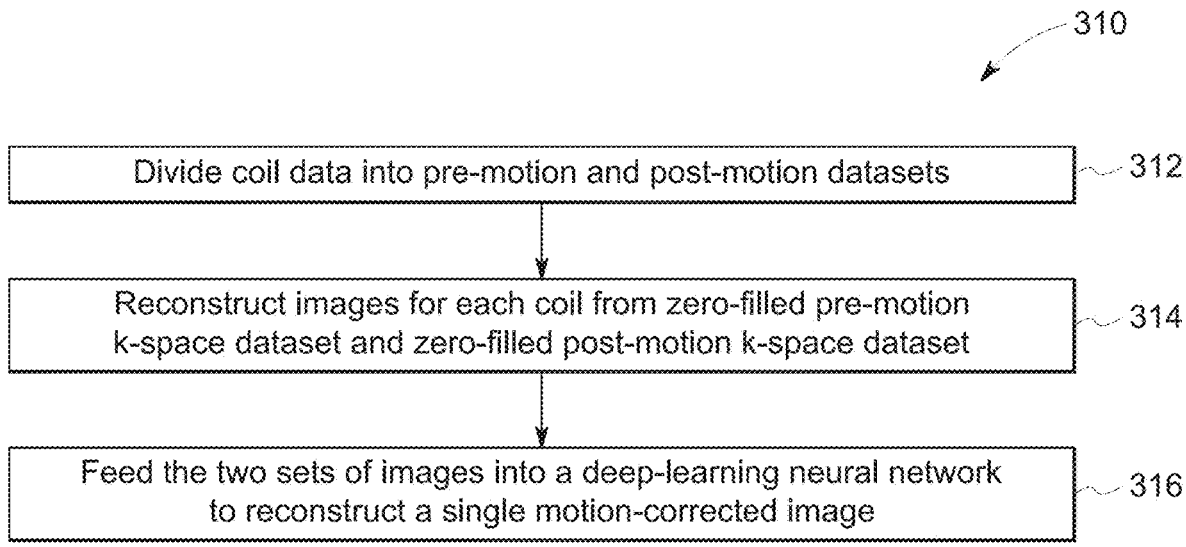
FIG. 20 is an embodiment of a method of reconstructing a motion-free image from motion-corrupted datasets.

The disclosed embodiments also include methods for image reconstruction when motion has occurred. For example, FIGS. 20 and 21 both depict embodiments of methods that can be used to reconstruct a motion artifact-free image. FIG. 20, in particular, is a method 310 for reconstructing a motion artifact-free image by first dividing coil data (block 312) into pre-motion and post-motion datasets. For example, using the scan order and the timing of when the motion occurred, the coils' k-space data is broken into two sets. The first set includes the parts of k-space that were scanned before the subject movement occurred and the second set the data after the movement occurred.

After the coil data is divided, for each coil two images are reconstructed (block 314). The first image is reconstructed using the zero-filled k-space data collected before the movement occurred, and the second image is reconstructed using the zero filled k-space data collected after the movement. In method 310, the two sets of images for each coil are fed (block 316) into a deep-learning neural network that reconstructs a single motion-corrected image.

Figure 21:
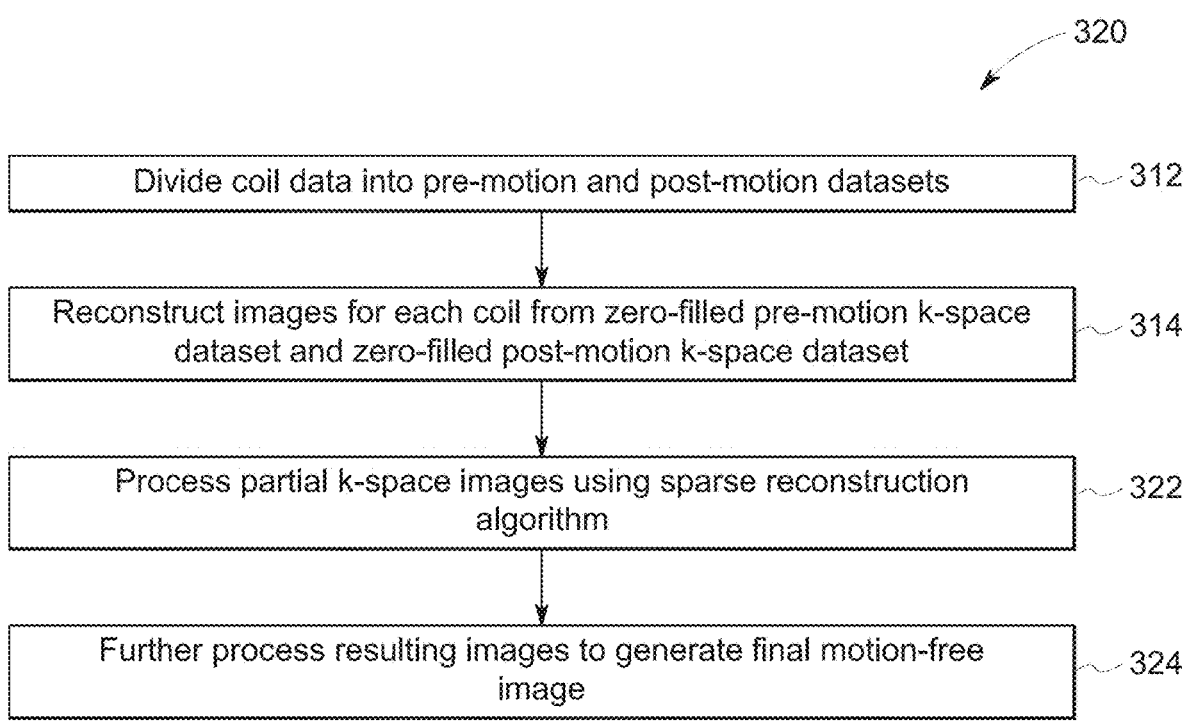
FIG. 21 is another embodiment of a method of reconstructing a motion-free image from motion-corrupted datasets.

Method 320, on the other hand and as depicted in FIG. 21, includes the acts represented by blocks 312 and 314, but instead the partial k-space images are each processed using a sparse reconstruction algorithm (block 322). The images resulting from the sparse reconstruction algorithm may then be further processed and combined, or fed to a neural network to generate a final motion-free image (block 324).

Technical effects of the invention include automatic detection and timing of patient movement, and mitigation of the effects of the patient movement on an overall MR scan. Remedial actions may include restarting the scan, reacquiring those portions of k-space acquired before the movement, or correcting for the motion using the existing data. In this way, the motion detection and correction techniques described herein may improve the throughput of MRI machines, improve the patient experiences and reduce burden on MR technicians.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging (MRI) method comprising:
    producing a first sub-image from first magnetic resonance (MR) partial k-space data acquired by an MM system during a first time interval from a patient;
    producing a second sub-image from second MR partial k-space data acquired by the MRI system during a second time interval from the patient, wherein the first time interval and the second time interval are adjacent to one another in time;
    combining the first sub-image and the second sub-image to generate a combined sub-image;

using a trained neural network to generate a prediction relating to the presence and extent of motion occurring between the first time interval and the second time interval using the combined sub-image as an input; and performing further operations of the MRI system based at least partially on the prediction generated by the trained neural network, wherein performing further operations of the MRI system based at least partially on the prediction generated by the trained neural network comprises, in response to determining that the prediction indicates that motion has occurred between the first and second time intervals:

aggregating the first MR data with MR data collected before the first time interval as k-space data corresponding to a first motion state as a first aggregate;

aggregating the second MR data with MR data collected after the first time interval as k-space data corresponding to a second motion state as a second aggregate; and separately reconstructing the first aggregate and the second aggregate to produce a first motion-free sub-image and a second motion-free sub-image, respectively.

2. The method of claim 1, wherein the partial k-space data from the first time interval and the partial k-space data second time interval are from a single coil within a multi-coil receiver array of the MRI system.

3. The method of claim 1, wherein the prediction relating to the presence and extent of motion occurring between the first time interval and the second time interval is a motion score, and wherein the motion score is calculated such that as the magnitude of the motion score increases, motion is more likely to have had an effect on the combined sub-image.

4. The method of claim 3, wherein a motion score is calculated for each coil in a multi-coil receiver array of the MRI system to generate motion scores for the multi-coil receiver array, and the motion scores for the multi-coil receiver array are combined into a net motion score, by taking mean, median, maximum, or minimum of individual coil scores.

5. The method of claim 4, comprising determining whether motion has occurred by comparing the net motion score to a threshold.

6. The method of claim 3, wherein the motion score is based on a weighted sum, or a log of a weighted sum, or average, of a per-pixel metric of the difference between the combined sub-image and a combined sub-image obtained if there is no motion between the first and second time intervals.

7. The method of claim 6, where the per-pixel metric is a per-pixel entropy of the difference, or per-pixel difference, or per-pixel log of the difference, or per-pixel log of the absolute value of the difference.

8. The method of claim 1, wherein producing the first sub-image comprises using only the first MR data collected during the first time interval, and wherein producing the second sub-image comprises using only the second MR data collected during the second time interval.

9. The method of claim 1, wherein the first sub-image and the second sub-image are complex, and are combined by addition.

10. The method of claim 1, wherein the first sub-image and the second sub-image are combined by aggregation of their respective partial k-space data in k-space, before transformation into the image domain.

11. The method of claim 1, wherein producing the first sub-image using the first MR data collected during the first time interval and producing the second sub-image using the second MR data collected during the second time interval comprises using data collected by all receiving coils of a receiving coil array of the MRI system during the first time interval and the second time interval, respectively.

12. The method of claim 1, wherein the trained neural network is a trained convolutional neural network having a plurality of convolutional layers, a plurality of max pooling layers, and a plurality of fully connected layers.

13. The method of claim 1, wherein the trained neural network is trained according to a training process comprising:

generating training data via a training data generation process comprising:

simulating rigid-body motion by applying translation and/or rotation to a motion-free image to generate an offset image;

replacing portions of motion-free k-space data of the motion-free image with k-space data of the offset image to generate motion-corrupted mixed k-space data according to a scan order, wherein the scan order describes how k-space was filled via phase encodes as a function of time step;

simulating partial data collection by applying a mask to the mixed k-space data according to the scan order to generate partial k-space data;

generating a motion-corrupted sub-image from the partial k-space data; and calculating a motion score for the motion-corrupted sub-image based at least partially on a difference between the motion-corrupted sub-image and a corresponding motion-free sub-image generated using corresponding partial k-space data of the motion-free image;

repeating at least a portion of the training data generation process by applying different translations and/or rotations to the motion-free image or other motion-free images to produce a population of motion-corrupted sub-images and associated motion scores; and training a neural network with at least some of the population of motion-corrupted sub-images and associated motion scores to generate the trained neural network.

14. The method of claim 1, wherein performing further operations of the MRI system based at least partially on the prediction generated by the trained neural network further comprises registering and combining the first motion-free sub-image and the second motion-free sub-image.

15. A computer-based method that generates a trained neural network to generate predictions relating to the presence and extent of motion in magnetic resonance (MR) sub-images comprising:

providing training data comprising motion-corrupted sub-images as available inputs and corresponding motion scores as outputs, wherein the training data is generated by a training data generation process comprising:

applying translation and/or rotation to a motion-free image to produce an offset image;

replacing a portion of motion-free k-space data associated with the motion-free image with motion-corrupted k-space data associated with the offset image to generate mixed k-space data; and simulating partial data collection by applying a mask to the mixed k-space data according to a scan order to generate partial k-space data, wherein the scan order defines how k-space was filled with the motion-free k-space data as a function of time step for the motion-free image, and wherein the mask defines a section of k-space from which to collect the partial k-space data, the section corresponding to adjacent time steps in the scan order;

training, using the training data, a neural network to transform an MR sub-image into a corresponding motion score that indicates whether motion occurred during an MM scan used to obtain data for the MR sub-image;

wherein the motion-corrupted sub-images are generated from at least one motion-free sub-image, and wherein the motion scores are calculated based on a weighted sum of a per-pixel difference metric between the at least one motion-free sub-image and a corresponding one of the motion-corrupted sub-images.

16. The method of claim 15, wherein the training data generation process further comprises:

generating a motion-corrupted sub-image from the partial k-space data;

generating a motion-free sub-image using a portion of the motion-free k-space data, the portion of the motion-free k-space data corresponding to the same section of k-space defined by the mask; and calculating a motion score for the motion-corrupted sub-image as an entropy-of-the-difference between a motion-free sub-image and the motion-corrupted sub-image.

17. The method of claim 16, wherein a magnitude of the motion score corresponds to an extent to which motion affected the motion-corrupted sub-image.

18. The method of claim 16, comprising repeating at least a portion of the training data generation process by applying different translations and/or rotations to the motion-free image or other motion-free images to produce a population of motion-corrupted sub-images and associated motion scores.

19. A magnetic resonance imaging (MM) system comprising:

control and analysis circuitry comprising programming to acquire magnetic resonance (MR) data using coil elements of the MM system, analyze the MR data, and reconstruct the MR data into MR sub-images; and a trained neural network associated with the control and analysis circuitry to transform the MR sub-images into a prediction relating to a presence and extent of motion corruption in the MR sub-images; and wherein the programming of the control and analysis circuitry comprises instructions to control operations of the MRI system based at least in part on the prediction of the trained neural network, and wherein the programming to reconstruct the MR data into MR sub-images comprises instructions to aggregate the MR data according to motion states identified based on predictions of the trained neural network.

20. The system of claim 19, wherein the programming of the control and analysis circuitry comprises instructions to:

acquire the MR data via an acquisition process performed according to a scan order that defines how k-space is filled as a function of time step;

generate an MR sub-image from MR data acquired in adjacent time steps in the scan order; and provide the MR sub-image to the trained neural network for transformation into the prediction relating to the presence and extent of motion corruption in the MR sub-image.

* * * * *